(12) United States Patent
Tsuji

(10) Patent No.: US 12,166,474 B2
(45) Date of Patent: Dec. 10, 2024

(54) CONTROLLER OF POWER TRANSISOR AND CONTROL METHOD THEREOF

(71) Applicant: ROHM CO., LTD., Kyoto (JP)

(72) Inventor: Masanobu Tsuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 39 days.

(21) Appl. No.: 18/303,992

(22) Filed: Apr. 20, 2023

(65) Prior Publication Data

US 2023/0261646 A1 Aug. 17, 2023

Related U.S. Application Data

(63) Continuation of application No. PCT/JP2021/037435, filed on Oct. 8, 2021.

(30) Foreign Application Priority Data

Oct. 21, 2020 (JP) .................. 2020-176816

(51) Int. Cl.
H03K 17/04 (2006.01)
H03K 17/042 (2006.01)
H03K 17/10 (2006.01)
H03K 17/687 (2006.01)

(52) U.S. Cl.
CPC ..... *H03K 17/04206* (2013.01); *H03K 17/102* (2013.01); *H03K 17/6871* (2013.01)

(58) Field of Classification Search
None
See application file for complete search history.

(56) References Cited

U.S. PATENT DOCUMENTS

| 7,330,046 B2* | 2/2008 | Durbaum ............. H03K 17/122 |
| | | 324/750.01 |
| 11,545,971 B2* | 1/2023 | Strzalkowski ..... G01R 31/2628 |

FOREIGN PATENT DOCUMENTS

| JP | 2013258857 A | 12/2013 |
| JP | 2017225227 A | 12/2017 |
| WO | 2019130533 A1 | 7/2019 |

OTHER PUBLICATIONS

Ccoa et al., "Investigation of Temperature Sensitive Electrical Parameters for Power Semiconductors (IGBT) in Real-Time Applications", International Exhibition and Conference for Power Electronics, Intelligent Motion, 2014, pp. 1-9.

Chen et al., "Real-Time Temperature Estimation for Power MOSFETs Considering Thermal Aging Effects", IEEE Transactions on Device and Materials Reliability, vol. 14, No. 1, pp. 220-228, Mar. 2014.

(Continued)

*Primary Examiner* — Jeffrey S Zweizig
(74) *Attorney, Agent, or Firm* — CANTOR COLBURN LLP

(57) ABSTRACT

A controller controls multiple parallel-coupled power transistors. A correction amount calculation unit generates a reference value based on multiple detection values, each of which has a correlation with the switching loss of corresponding one of the multiple power transistors, and generates multiple correction amounts such that the multiple detection values approach the reference value. A gate signal generating unit generates multiple gate signals based on a control instruction and the multiple correction amounts.

18 Claims, 14 Drawing Sheets

(56) References Cited

OTHER PUBLICATIONS

Eleffendi et al., "Evaluation of On-state Voltage VCE(ON) and Threshold Voltage Vth for Real-time Health Monitoring of IGBT Power Modules", 2015 17th European Conference on Power Electronics and Applications (EPE'15 ECCE-Europe), Geneva, 2015, pp. 1-10.
International Search Report for corresponding International Application No. PCT/JP2021/037435; Mailing Date, Dec. 21, 2021.
Miyazaki et al., "CNN-based Approach for Estimating Degradation of Power Devices by Gate Waveform Monitoring", 2019 International Conference on IC Design and Technology (ICICDT), 2019, pp. 1-4.
PCT International Preliminary Report of Patentability for International Application No. PCT/JP2021/037435; Date of Issuance of Report, Apr. 13, 2023; with Written Opinion of the International Searching Authority; Date of Mailing, Dec. 21, 2021.

\* cited by examiner

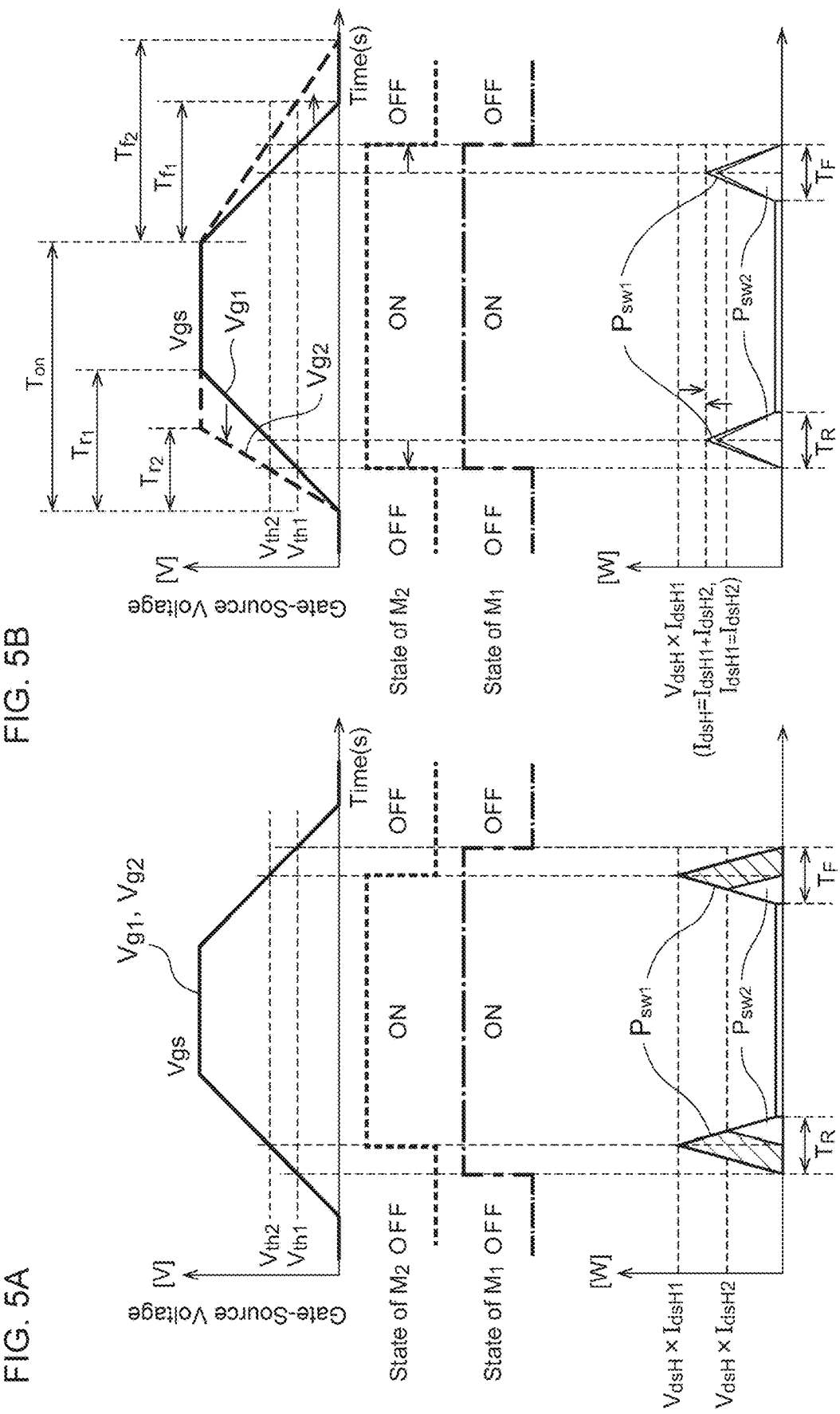

CONTROLLER OF POWER TRANSISOR AND CONTROL METHOD THEREOF

CROSS REFERENCES TO RELATED APPLICATIONS

This application is a continuation under 35 U.S.C. § 120 of PCT/JP2021/037435, filed Oct. 8, 2021, which is incorporated herein by reference, and which claimed priority to Japanese Application No. 2020-176816, filed Oct. 21, 2020, the entire content of which is also incorporated herein by reference.

BACKGROUND

1. Technical Field

The present disclosure relates to a driving technique for a power transistor.

2. Description of the Related Art

A power conversion apparatus such as a DC/DC converter, AC/DC converter, DC/AC converter (inverter), or the like is employed in hybrid vehicles, electric vehicles, and industrial equipment. A power conversion apparatus includes a power transistor such as an Insulated Gate Bipolar Transistor (IGBT), FET, or the like, and a driver circuit thereof as its basic components.

FIGS. 1A and 1B are diagrams for explaining power loss of the power transistor. The upper graph in FIG. 1B shows the gate-source voltage Vgs, and the middle graph shows the drain-source voltage Vds and the drain current Ids. Furthermore, the lower graph shows the loss that corresponds to the product of the drain voltage Vds and the drain current Ids. The drain current in the on period is represented by $Ids_{(ON)}$. The drain voltage thereof is represented by $Vds_{(ON)}$. During the off period, description will be made assuming that the drain current is zero, and the drain voltage is represented by $Vds_{(OFF)}$.

Power loss in the power transistor is roughly classified into conduction loss Pon and switching loss Psw. The conduction loss Pon is the loss in the on period of the power transistor. It should be noted that description will be made assuming that the switching loss does not include charge/discharge loss that occurs when the gate of the power transistor is driven.

The switching loss Psw represents the loss in the turn-on period $T_R$ and the turn-off period $T_F$ when state transitions occur in the power transistor. The switching loss is represented by the following Expression (1).

$$Psw = \{(Vds_{(OFF)} \times Ids_{(ON)})/(T_R+T_F) \times fsw \quad (1)$$

Here, fsw represents the switching frequency.

In high-power usages, multiple power transistors are employed such that they are coupled in parallel. In such a case in which multiple power transistors are coupled in parallel, variations occur in the switching loss due to variations of individual device characteristics (threshold values). FIGS. 2A and 2B are diagrams for explaining losses in a circuit of two power transistors coupled in parallel.

As shown in FIG. 2A, two transistors $M_1$ and $M_2$ are arranged such that their gates are coupled so as to form a common gate, their drains are coupled so as to form a common drain, and their sources are coupled so as to form a common source. In this arrangement, the gate voltages $Vgs_1$ and $Vgs_2$ are equal. Furthermore, the drain voltages $Vds_1$ and $Vds_2$ are equal.

FIG. 2B shows the switching loss of two power transistors $M_1$ and $M_2$. Description will be made assuming that variations exist in the threshold values $Vth_1$ and $Vth_2$, and $Vth_1 < Vth_2$. In this case, a relatively large amount of current flows through the power transistor $M_1$. Accordingly, the switching loss of the transistor $M_1$ is larger than that of the transistor $M_2$.

A power transistor with a large switching loss has a relatively high temperature as compared with a power transistor with a small switching loss. This will be referred to as a "hot spot". The threshold value Vth of a power transistor has negative temperature characteristics. Accordingly, the threshold value $Vth_1$ of the power transistor $M_1$ positioned at such a hot spot becomes even lower. This leads to a larger amount of current $Ids_1$ flowing, leading to further heat generation.

Such a hot spot leads to thermal runaway. Also, this becomes a cause of aging degradation or degraded reliability. Furthermore, such an increase of switching loss leads to degradation of system efficiency. In a case in which a large heat sink is mounted as a countermeasure, this has a tradeoff problem in that such an apparatus has a large size.

RELATED ART DOCUMENT LIST

Non-Patent Document 1

J. A. Butron Ccoa, B. Strauss, G. Mitic and A. Lindemann, "Investigation of Temperature Sensitive Electrical Parameters for Power Semiconductors (IGBT) in Real-Time Applications", PCIM Europe 2014; International Exhibition and Conference for Power Electronics, Intelligent Motion, Renewable Energy and Energy Management, Nuremberg, Germany, 2014, pp. 1-9.

Non-Patent Document 2

M. A. Eleffendi and C. M. Johnson, "Evaluation of on-state voltage VCE(ON) and threshold voltage Vth for real-time health monitoring of IGBT power modules", 2015 17th European Conference on Power Electronics and Applications (EPE'15 ECCE-Europe), Geneva, 2015, pp. 1-10.

Non-Patent Document 3

H. Chen, B. Ji, V. Pickert and W. Cao, "Real-Time Temperature Estimation for Power MOSFETs Considering Thermal Aging Effects", IEEE Transactions on Device and Materials Reliability, vol. 14, no. 1, pp. 220-228, March 2014.

Non-Patent Document 4

K. Miyazaki, Y Lo, A. K. M. Mahfuzul Islam, K. Hata, M. Takamiya and T. Sakurai, "CNN-based Approach for Estimating Degradation of Power Devices by Gate Waveform Monitoring", 2019 International Conference on IC Design and Technology (ICICDT), SUZHOU, China, 2019, pp. 1-4.

SUMMARY

The present disclosure has been made in view of such a situation.

An embodiment of the present disclosure relates to a controller structured to control multiple parallel-coupled power transistors. The controller includes: a correction amount calculation unit structured to generate a reference value based on multiple detection values, each of which has a correlation with a switching loss of corresponding one of the multiple power transistors, and to generate multiple correction amounts such that the multiple detection values approach the reference value; and a gate signal generating unit structured to generate multiple gate signals that correspond to the multiple power transistors based on a control instruction and the multiple correction amounts.

An embodiment of the present disclosure relates to a controller to be employed in a power conversion apparatus provided with multiple parallel-coupled power transistors. The controller includes: a main controller structured to calculate a duty cycle instruction value of a control pulse such that the state of the power conversion apparatus approaches a target state; an A/D converter structured to convert multiple electrical signals, each of which has a correlation with a switching loss of corresponding one of the multiple power transistors into multiple digital detection values; a correction amount calculation unit structured to generate a reference value based on the multiple detection values, and to generate multiple correction amounts such that the multiple detection values approach the reference value; a duty cycle correction unit structured to correct the duty cycle instruction value based on the multiple correction amounts so as to generate multiple corrected duty cycle instruction values; and a pulse converter structured to receive the multiple corrected duty cycle instruction values, and to generate multiple gate signals that correspond to the multiple power transistors.

An embodiment of the present disclosure relates to a controller to be employed in a power conversion apparatus provided with multiple parallel-coupled power transistors. The controller includes: a main controller structured to calculate a duty cycle instruction value of a control pulse such that the state of the power conversion apparatus approaches a target state; an A/D converter structured to convert multiple electrical signals, each of which has a correlation with a switching loss of corresponding one of the multiple power transistors into multiple digital detection values; a correction amount calculation unit structured to generate a reference value based on the multiple detection values, and to generate multiple correction amounts such that the multiple detection values approach the reference value; a pulse converter structured to generate the control pulse having a duty cycle that corresponds to the duty cycle instruction value; and a gate signal generating unit structured to receive the control pulse and the multiple correction amounts, and to generate multiple gate signals each having a slew rate that corresponds to the corresponding one of the multiple correction amounts.

It is to be noted that any arbitrary combination or rearrangement of the above-described structural components and so forth is effective as and encompassed by the present embodiments. Moreover, all of the features described in this summary are not necessarily required by embodiments so that the embodiment may also be a sub-combination of these described features. In addition, embodiments may have other features not described above.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 5A and 5B are waveform diagrams for explaining slew rate correction;

DETAILED DESCRIPTION

Overview of the Embodiments

Figure 1A:
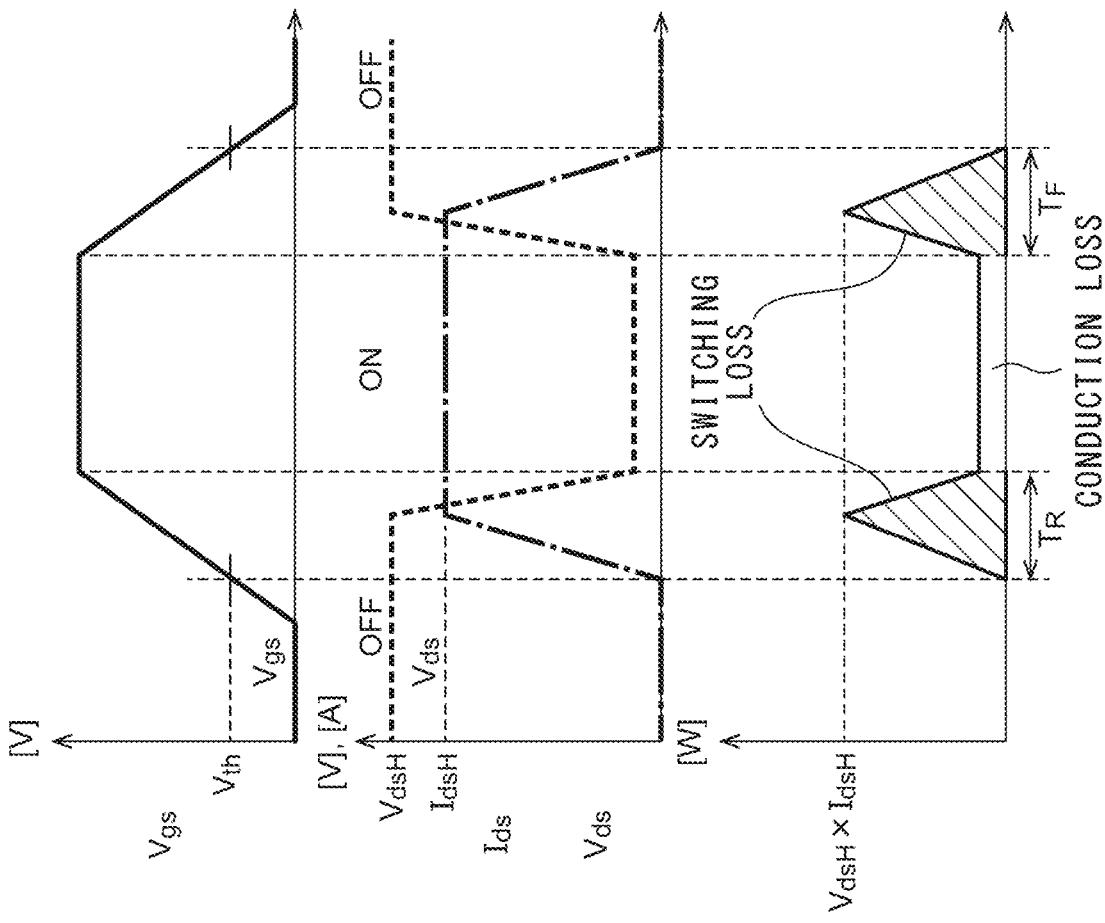
FIGS. 1A and 1B are diagrams for explaining loss in the power transistor.
Figure 1B:
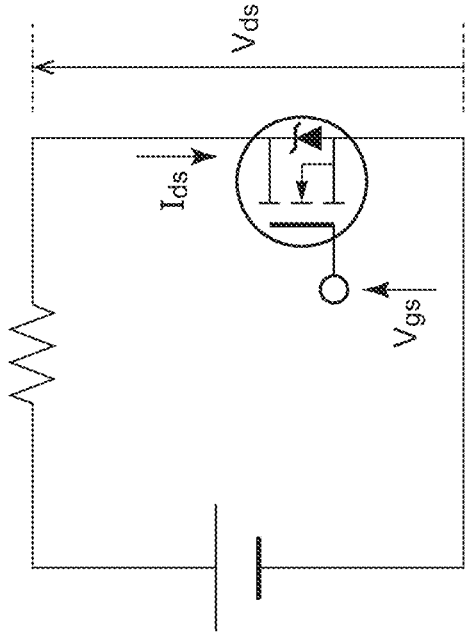

An outline of several example embodiments of the disclosure follows. This outline is provided for the convenience of the reader to provide a basic understanding of such embodiments and does not wholly define the breadth of the disclosure. This outline is not an extensive overview of all contemplated embodiments and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "one embodiment" may be used herein to refer to a single embodiment or multiple embodiments of the disclosure.

A controller according to one embodiment controls multiple parallel-coupled power transistors. The controller includes: a correction amount calculation unit structured to generate a reference value based on multiple detection values, each of which has a correlation with a switching loss of corresponding one of the multiple power transistors, and to generate multiple correction amounts such that the multiple detection values approach the reference value; and a gate signal generating unit structured to generate multiple gate signals that correspond to the multiple power transistors based on a control instruction and the multiple correction amounts.

With this configuration, feedback is applied such that the switching loss of each of the multiple power transistors approaches a common target value. As a result, this allows the temperatures of the multiple power transistors to be made uniform. This suppresses the occurrence of a hot spot. Accordingly, it is anticipated that such an arrangement will provide improved reliability and efficiency. Furthermore, a large heat sink is not required, thereby allowing the apparatus to have a compact size.

In one embodiment, the gate signal generating unit may correct the pulse width of a gate signal of each of the multiple power transistors based on the corresponding one of the multiple correction amounts. In a case in which the pulse width of the gate signal of a given power transistor is widened, this increases the switching loss. In contrast, in a case in which the pulse width is narrowed, this reduces the switching loss. Accordingly, with such an arrangement in which the pulse width is employed as a feedback control amount, this allows the switching loss to be made uniform.

In one embodiment, the gate signal generating unit may correct a slew rate of the gate signal of each of the multiple power transistors based on the corresponding one of the multiple correction amounts. In a case in which the slew rate (slope) of an edge that corresponds to turn-on of the gate signal of a given power transistor is relatively increased (i.e., in a case in which transition time is reduced), or in a case in which the slew rate (slope) of an edge that corresponds to turn-off is relatively reduced (i.e., in a case in which transition time is increased), the switching loss is increased. Conversely, in a case in which the slew rate (slope) of an edge that corresponds to turn-on is relatively reduced, or in a case in which the slew rate (slope) of an edge that corresponds to turn-off is relatively increased, the switching loss is reduced. Accordingly, with such an arrangement in which the slew rate is employed as a feedback control amount, this allows the switching loss to be made uniform.

In one embodiment, both the slew rate (transition time) correction and the pulse width correction may be employed together.

In one embodiment, as the detection value to be used to calculate the correction amount, a temperature detection value that indicates the temperature of the power transistor may be employed. The temperature of the power transistor has a positive correlation with the switching loss. Accordingly, with such an arrangement in which the temperature is monitored, such an arrangement is capable of estimating the switching loss. For example, a temperature sensor such as a thermistor, diode, or the like, may be arranged in the vicinity of the power transistor so as to detect the temperature.

In one embodiment, as a detection value to be used to calculate the correction amount, a threshold voltage at which the power transistor transits between the on state and the off state may be employed.

In one embodiment, the controller may further include: a waveform acquisition unit structured to measure the waveform of a gate voltage of each of the multiple power transistors; and a temperature estimator structured to generate the corresponding one of the multiple detection values based on the waveform of the gate voltage of each of the multiple power transistors.

In one embodiment, the temperature estimator may include an estimator based on a learning model obtained by machine learning.

In one embodiment, the detection value may be based on a product of a measured value of a drain current and a measured value of a drain-source voltage of the power transistor.

In one embodiment, the correction amount calculation unit may include multiple proportional-integral-differential (PID) compensators.

In one embodiment, the correction amount calculation unit may include: multiple first multipliers structured to multiply outputs of the multiple PID compensators by a first coefficient so as to generate multiple first correction amounts; and multiple second multipliers structured to multiply outputs of the multiple PID compensators by a second coefficient so as to generate multiple second correction amounts. Also, a correction processing unit may correct a slew rate of the gate signal of each of the multiple power transistors based on the corresponding one of the multiple first correction amounts. Also, the correction processing unit may correct the pulse width of the gate signal of each of the multiple power transistors based on the corresponding one of the multiple second correction amounts.

In one embodiment, the gate signal generating unit may include multiple gate drivers that correspond to the multiple power transistors. Also, the multiple gate drivers may each include: an output node coupled to a gate of the corresponding power transistor; a multi-stage delay circuit structured to delay a control pulse; multiple first transistors each having one end coupled to a first voltage line and the other end coupled to the output node; multiple second transistors each having one end coupled to a second voltage line and the other end thereof to the output node; multiple first logic gates that correspond to the multiple first transistors, and structured such that, when a corresponding bit of a first control code is a predetermined value, the corresponding first logic gate supplies a corresponding output of the multi-stage delay circuit to a gate of the corresponding first transistor; and multiple second logic gates that correspond to the multiple second transistors, and structured such that, when a corresponding bit of a second control code is a predetermined value, the corresponding second logic gate supplies a corresponding output of the multi-stage delay circuit to a gate of the corresponding second transistor.

In one embodiment, the controller may further include a monitoring circuit structured to generate a warning flag based on the multiple correction amounts. This allows the system to be provided with improved reliability.

In one embodiment, the controller may further include an A/D converter structured to convert multiple detection signals, each of which has a correlation with a switching loss of corresponding one of the multiple power transistors into the multiple detection values.

In one embodiment, the multiple power transistors may each be configured as a switching transistor or a synchronous rectification transistor of a switching converter.

In one embodiment, the switching converter may be configured as a multi-phase switching converter. Also, the controller may output respective gate signals of the multiple power transistors with a phase difference of 360°/N.

In one embodiment, the multiple power transistors may form an upper arm or a lower arm of an inverter.

Embodiments

Description will be made below regarding the present disclosure based on preferred embodiments with reference to the drawings. The same or similar components, members, and processes are denoted by the same reference numerals, and redundant description thereof will be omitted as appropriate. The embodiments have been described for exemplary purposes only, and are by no means intended to restrict the present disclosure. Also, it is not necessarily essential for the present disclosure that all the features or a combination thereof be provided as described in the embodiments.

In the present specification, the state represented by the phrase "the member A is coupled to the member B" includes a state in which the member A is indirectly coupled to the member B via another member that does not substantially affect the electrical connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C, via another member that does not substantially affect the electrical connection between them, or that does not damage the functions or effects of the connection between them, in addition to a state in which they are directly coupled.

Also, the phrase "a signal A (voltage or current) corresponds to a signal B (voltage or current)" means the state in which the signal A has a correlation with the signal B. Specific examples of such a state include: (i) a state in which the signal A is the same as the signal B; (ii) a state in which the signal A is proportional to the signal B; (iii) a state in which the signal A is obtained by shifting the level of the signal B; (iv) a state in which the signal A is obtained by amplifying the signal B; (v) a state in which the signal A is obtained by inverting the signal B; (vi) a desired combination of the aforementioned states (i) through (v); and the like. The range of "corresponds" as described above is determined by the kinds of the signals A and B and the usage of the signals A and B, which can clearly be understood by those skilled in this art.

In the present specification, the reference symbols denoting electrical signals such as a voltage signal, current signal, or the like, and the reference symbols denoting circuit elements such as a resistor, capacitor, or the like, also represent the corresponding voltage value, current value, resistance value, or capacitance value as necessary. Also, the reference symbols denoting terminals each represent a voltage or a signal level that occurs at the terminal.

Figure 3:
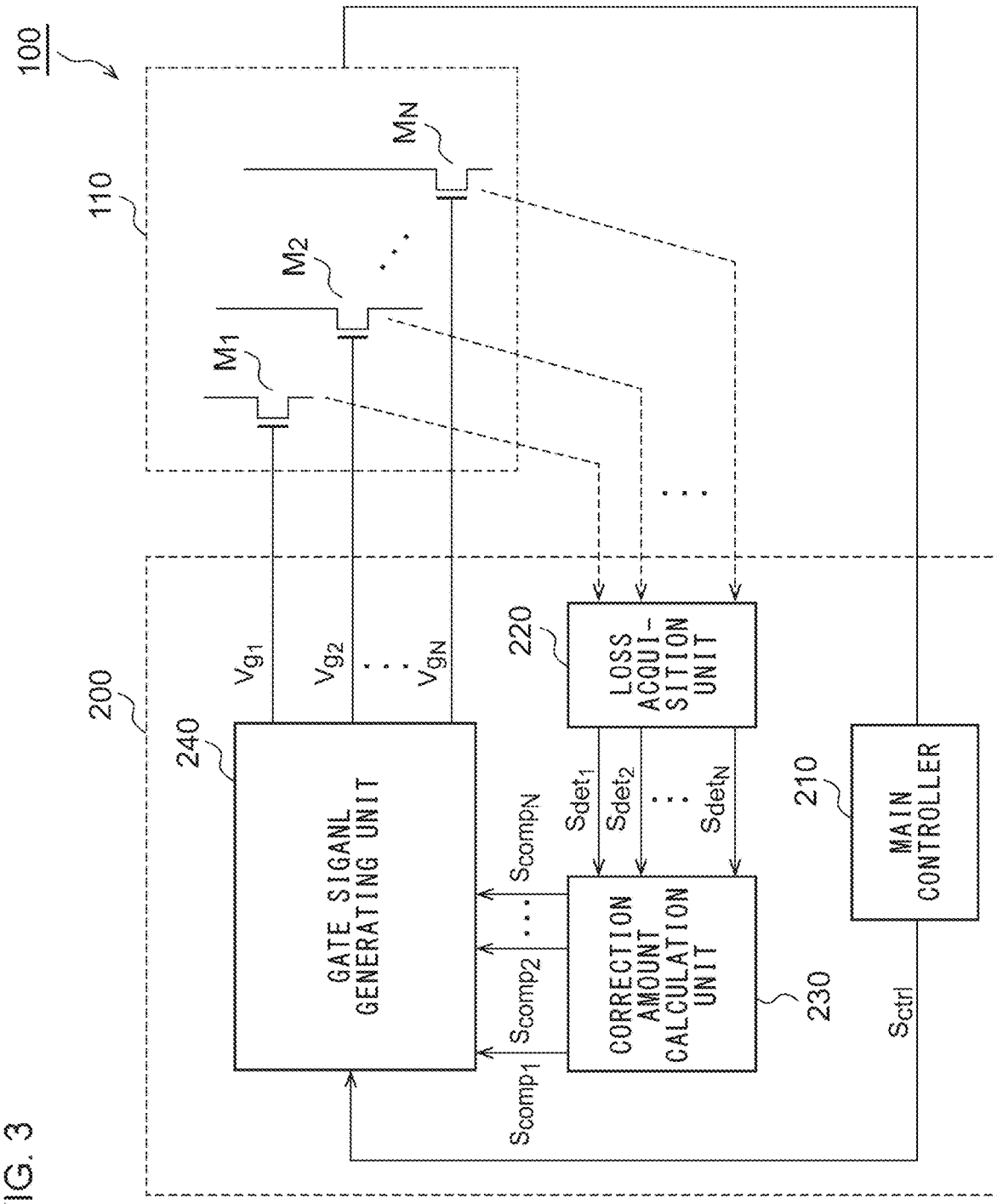
FIG. 3 is a block diagram of a switching circuit according to an embodiment.

FIG. 3 is a block diagram showing a switching circuit 100 according to an embodiment. The switching circuit 100 is part of a power conversion apparatus such as an inverter, converter, or the like. The switching circuit 100 includes a power stage 110 and a controller 200.

The power stage 110 includes a plurality of N (N≥2) power transistors $M_1$ through $M_N$, having independent control terminals (gates). The multiple power transistors $M_1$ through $M_N$ are provided on multiple paths arranged in parallel. It can be anticipated that an equal amount of current flows through each of the multiple paths.

The power transistors $M_1$ through $M_N$ may each be configured as a Field-Effect Transistor (FET) based on Si, SiC, GaN, or the like, or may each be configured as an Insulated Gate Bipolar Transistor (IGBT).

The controller 200 employs the electrical state of the switching circuit 100 or a load (not shown) as a control amount and drives the power stage 110 such that the control amount approaches a target state. Examples of the electrical state of the switching circuit 100 may include output power, output voltage, output current, and input current of the switching circuit 100 itself, and a voltage at a node in the load, power consumption of the load, etc.

The controller 200 includes a main controller 210, a loss acquisition unit 220, a correction amount calculation unit 230, and a gate signal generating unit 240. The controller 200 can be configured as an analog circuit, digital circuit, or analog/digital hybrid circuit.

The main controller 210 generates a control instruction Sctrl such that the control amount approaches the target amount. For example, the control instruction Sctrl is a signal for indicating the lengths of the on periods of the power transistors $M_1$ through $M_N$, i.e., the duty cycles thereof.

In a case in which the main controller 210 is configured as a digital circuit, the main controller 210 includes an error detector (adder/subtractor unit) that generates an error between the control amount and the target amount, and a filter that generates the control instruction Sctrl according to the error. The filter format is designed according to the characteristics of the power stage 110 or the characteristics of the load. As the filter, a proportional (P) compensator, proportional-integral (PI) compensator, proportional-integral-differential (PID) compensator, or the like, may be employed.

In a case in which the main controller 210 is configured as an analog circuit, the main controller 210 includes an error amplifier that amplifies an error between the control amount and the target amount.

The loss acquisition unit 220 generates multiple detection values $Sdet_1$ through $Sdet_N$ having correlation with switching losses of the respective power transistors $M_1$ to $M_N$. The configuration of the loss acquisition unit 220 is not restricted in particular so long as the loss acquisition unit 220 is capable of directly or indirectly measuring or estimating the temperature or power loss of each power transistor.

For example, the detection value $Sdet_i$ (i=1, 2, . . . , N) represents the temperature of the corresponding power transistor $M_i$. The loss acquisition unit 220 is arranged in the vicinity of the power transistor $M_i$. The loss acquisition unit 220 may include a temperature sensor that generates a temperature detection signal.

Alternatively, the detection value $Sdet_i$ may be the switching loss of the power transistor $M_i$ itself. In this case, the loss acquisition unit 220 is configured to be capable of generating a voltage detection signal that indicates a voltage across both ends of the power transistor $M_i$ (drain-source voltage) and a current detection signal that indicates the drain current of the power transistor $M_i$. Examples of a current detection method include a method using a Hall sensor, a method using a Rogowski coil, a method using a current transformer, and a method using a current detection resistor (shunt resistor). The loss acquisition unit 220 may generate the detection value $Sdet_i$ that indicates the switching loss based on Expression (1).

It should be noted that, in a case in which the correction amount calculation unit 230 or the gate signal generating unit 240 is configured as a digital circuit, the loss acquisition unit 220 further includes an A/D converter that converts the electrical signal into a digital value.

The correction amount calculation unit 230 generates a reference value Sref based on the multiple detection values $Sdet_1$ through $Sdet_N$ that indicate the switching losses of the multiple power transistors $M_1$ through $M_N$. Furthermore, the correction amount calculation unit 230 generates multiple correction amounts $Scomp_1$ through $Scomp_N$ such that the multiple detection values $Sdet_1$ through $Sdet_N$ each approach the reference value Sref. Here, the reference value Sref is obtained from the relative error of the detection values $Sdet_1$ through $Sdet_N$. By employing a detection value that is the center value as the reference value Sref, this is capable of generating a required correction amount having a minimum absolute value.

The gate signal generating unit 240 generates multiple gate signals $Vg_1$ through $Vg_N$ based on the control instruction Sctrl and multiple correction amounts $Scomp_1$ through $Scomp_N$. The multiple gate signals $Vg_1$ through $Vg_N$ each have common characteristics (pulse width, slew rate). The characteristics of each gate signal $Vg_1$ are corrected based on the corresponding one correction amount $Scomp_1$ among the multiple correction amounts $Scomp_1$ through $Scomp_N$.

Specifically, the gate signal generating unit 240 corrects at least one of the pulse width and the slew rate (transition time) of each of the multiple gate signals $Vg_1$ through $Vg_N$.

1. Pulse Width Correction

In a case in which only the pulse width is corrected, each correction amount $Scomp_i$ includes a pulse width correction amount $\Delta Ton_i$. The pulse width $Ton_i$ of each gate signal $Vg_i$ is represented by $Ton_i = Tonref + \Delta Ton_i$. Here, Tonref represents the pulse width before correction determined according to the control instruction Sctrl.

2. Slew Rate Correction

In a case in which only the slew rate is corrected, the correction amount Scomp includes slew rate correction amounts $\Delta Tr$ and $\Delta Tf$. Here, $\Delta Tr$ represents the correction value for the transition time of the rising edge of the gate signal (positive edge, leading edge). $\Delta Tf$ represents the correction amount for the transition time of the falling edge of the gate signal (negative edge, trailing edge). The correction amounts $\Delta Tf$ and $\Delta Tr$ will be collectively referred to as a "correction amount $\Delta Tsr$".

3. Pulse Width Correction and Slew Rate Correction

In a case in which both the pulse width and the slew rate are corrected, the correction amount $Scomp_i$ includes the pulse width correction amount $\Delta Ton_i$ and the slew rate correction amount $\Delta Tsr$.

The above is the basic configuration of the switching circuit 100. Next, description will be made regarding the operation thereof.

Pulse Width Correction

Figure 2A:
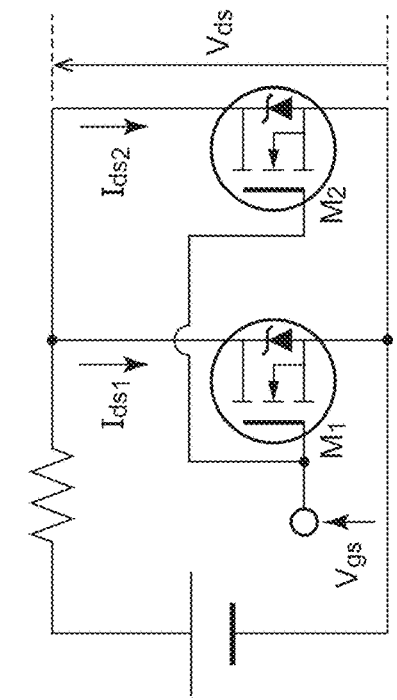
FIGS. 2A and 2B are diagrams for explaining power loss in a parallel connection circuit of two power transistors.
Figure 2B:
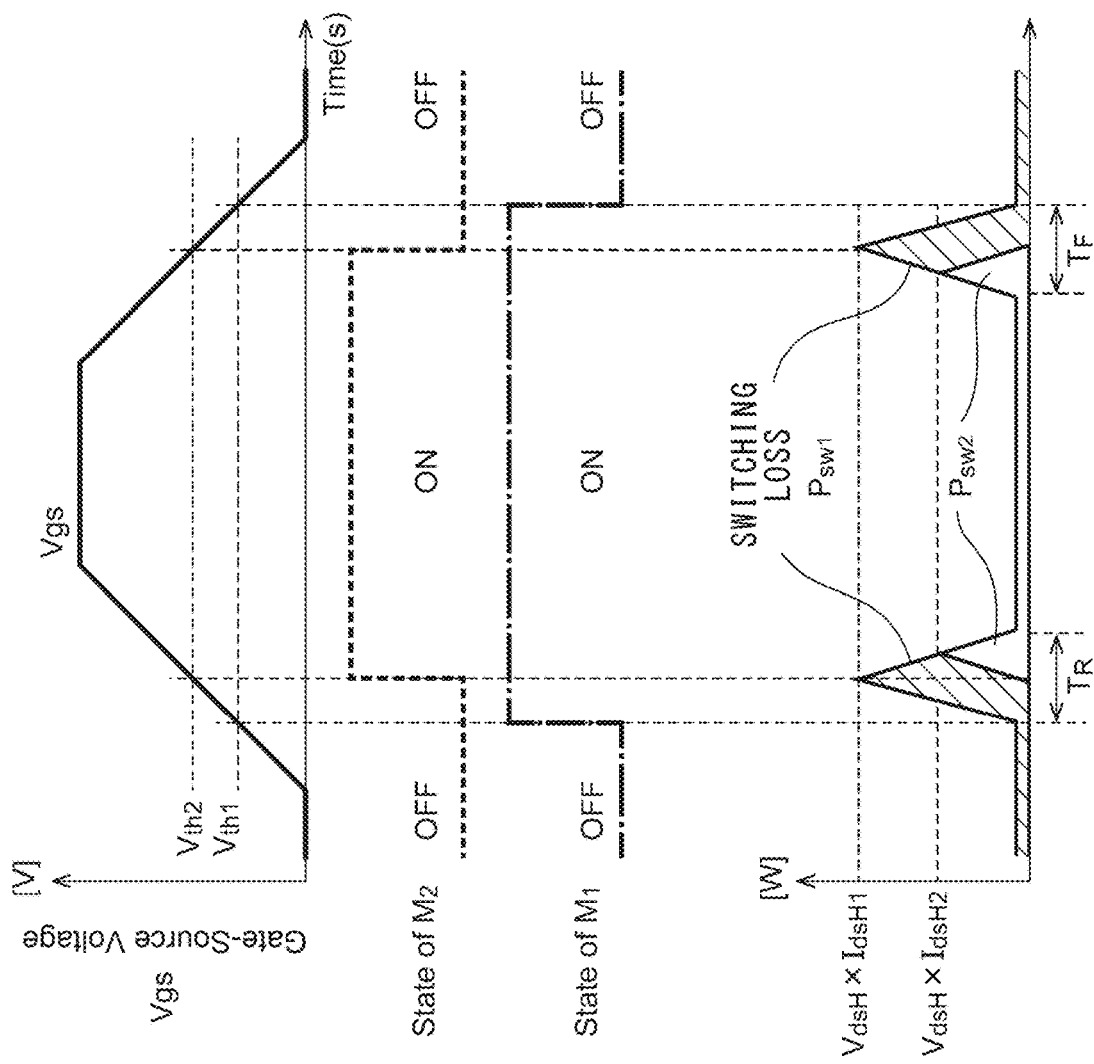
Figure 4A:
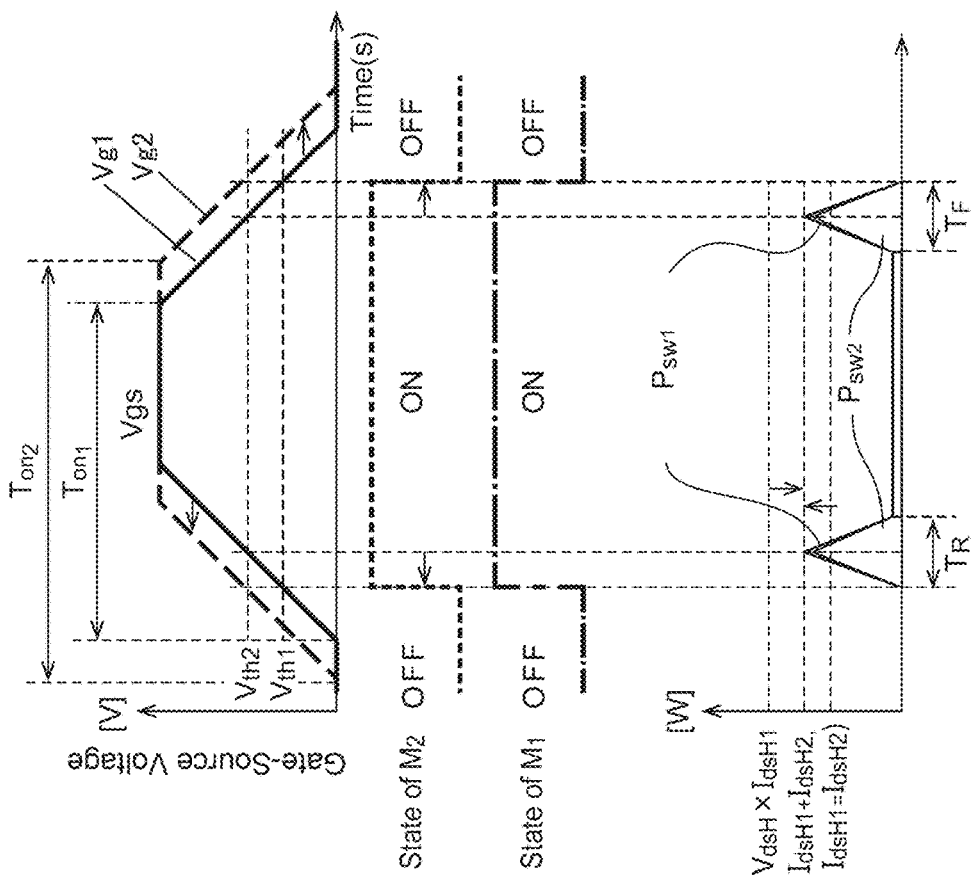
FIGS. 4A and 4B are waveform diagrams for explain pulse width correction.
Figure 4B:
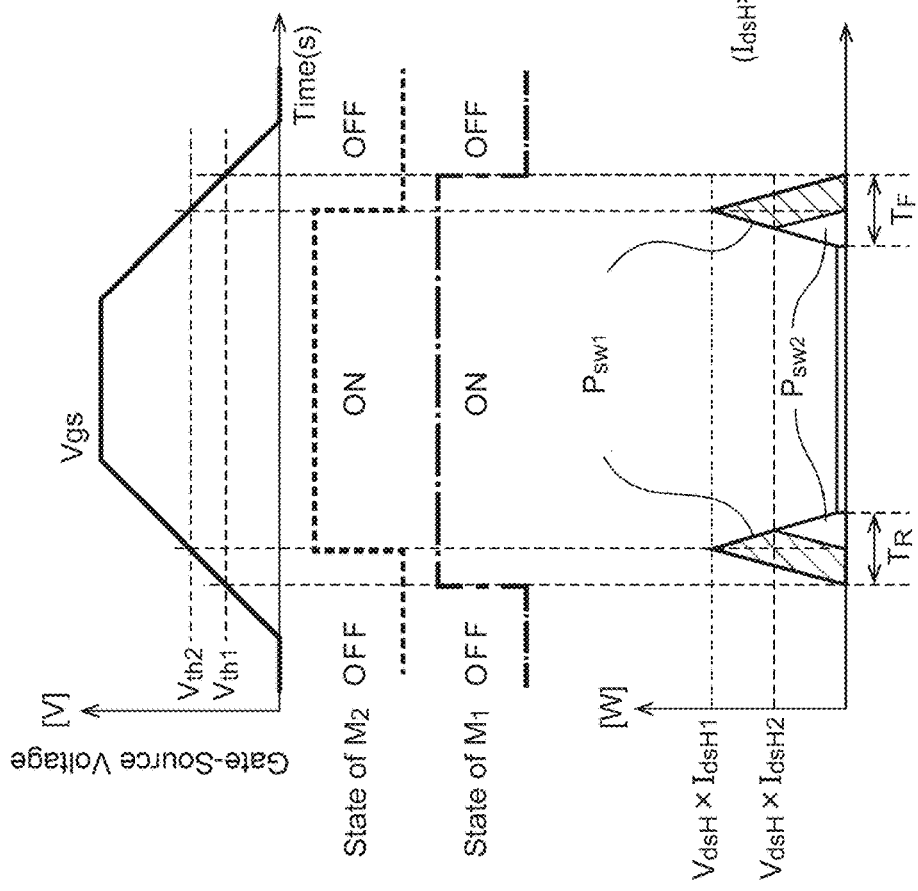

FIGS. 4A and 4B are waveform diagrams for explaining pulse width correction. In this example, description will be made regarding a case including two power transistors $M_1$ and $M_2$, where $Vth_1 < Vth_2$. FIG. 4A shows the operation without correction, and $Psw_1 > Psw_2$, as shown in FIG. 2B.

FIG. 4B shows the gate signals $Vg_1$ and $Vg_2$ of the power transistors $M_1$ and $M_2$ in a case in which the pulse width correction is executed. The pulse width correction is executed such that the pulse width $Ton_2$ of the gate signal $Vg_2$ becomes larger than the pulse width $Ton_1$ of the gate signal $Vg_1$.

With such an arrangement employing this pulse width correction, the switching losses $Psw_1$ and $Psw_2$ of the two power transistors $M_1$ and $M_2$ approach each other, thereby making the heat generation equal.

Slew Rate Correction

FIGS. 5A and 5B are waveform diagrams for explaining the slew rate correction. In this example, description will be made regarding a case including two power transistors $M_1$ and $M_2$ where $Vth_1 < Vth_2$. FIG. 5A shows the operation without correction, and $Psw_1 > Psw_2$, as shown in FIG. 2B.

FIG. 5B shows the gate signals $Vg_1$ and $Vg_2$ of the power transistors $M_1$ and $M_2$ when the slew rate correction is executed. In a case in which the power transistors $M_1$ and $M_2$ are each configured as an N-channel transistor, a positive edge corresponds to turn-on, and a negative edge corresponds to turn-off. The slew rate of the positive edge of the gate signal $Vg_2$ is corrected such that it becomes relatively higher than the slew rate of the gate signal $Vg_1$, i.e., such that the transition time $Tr_2$ of the gate signal $Vg_2$ becomes shorter than the transition time $Tr_1$ of the gate signal $Vg_1$.

$Tr_2 > Tr_1$

Furthermore, the slew rate of the negative edge of the gate signal $Vg_2$ is corrected such that it becomes relatively lower than that of the gate signal $Vg_1$, i.e., such that the transition time $Tf_2$ of the gate signal $Vg_2$ becomes longer than the transition time $Tf_1$ of the gate signal $Vg_1$.

$Tf_2 > Tf_1$.

With such an arrangement employing this slew rate correction, the switching losses $Psw_1$ and $Psw_2$ of the two power transistors $M_1$ and $M_2$ approach each other, thereby making the heat generation equal.

The above is the operation of the switching circuit 100. With this switching circuit 100, this allows the heat generation amounts of the multiple power transistors to approach each other. This is capable of preventing concentration of current in a particular power transistor, thereby protecting the circuit. Furthermore, the multiple power transistors operate equally. This allows the performance of the multiple power transistors to be brought out, thereby providing improved efficiency.

Furthermore, in a case in which a current concentrates in a particular power transistor, this leads to rapid progression of aging degradation in the particular transistor. In contrast, with the present embodiment, this is capable of slowing the progression of aging degradation in the multiple power transistors, thereby allowing the lifetime of the switching circuit 100 to be extended.

It should be noted that FIG. 3 shows an arrangement in which the main controller 210 and the gate signal generating unit 240 are integrated on the same IC. However, the present invention is not restricted to such an arrangement. Also, the main controller 210 and the gate signal generating unit 240 may be configured as separate ICs. In this case, the loss acquisition unit 220 and the correction amount calculation unit 230 may be integrated on the same IC (gate driver circuit) mounting the gate signal generating unit 240.

Description has been made above regarding the pulse width correction and the slew rate correction in which both the positive edge and the negative edge of the gate signal are corrected. Also, only one of the positive edge and the negative edge may be corrected.

The present disclosure encompasses various kinds of apparatuses and circuits that can be regarded as a block configuration or a circuit configuration shown in FIG. 3, or otherwise that can be derived from the aforementioned description. That is to say, the present invention is not restricted to a specific configuration. More specific description will be made below regarding an example configuration for clarification and ease of understanding of the essence of the present disclosure and the operation thereof. That is to say, the following description will by no means be intended to restrict the technical scope of the present disclosure.

Description will be made below regarding a specific configuration of the switching circuit 100.

Figure 6:
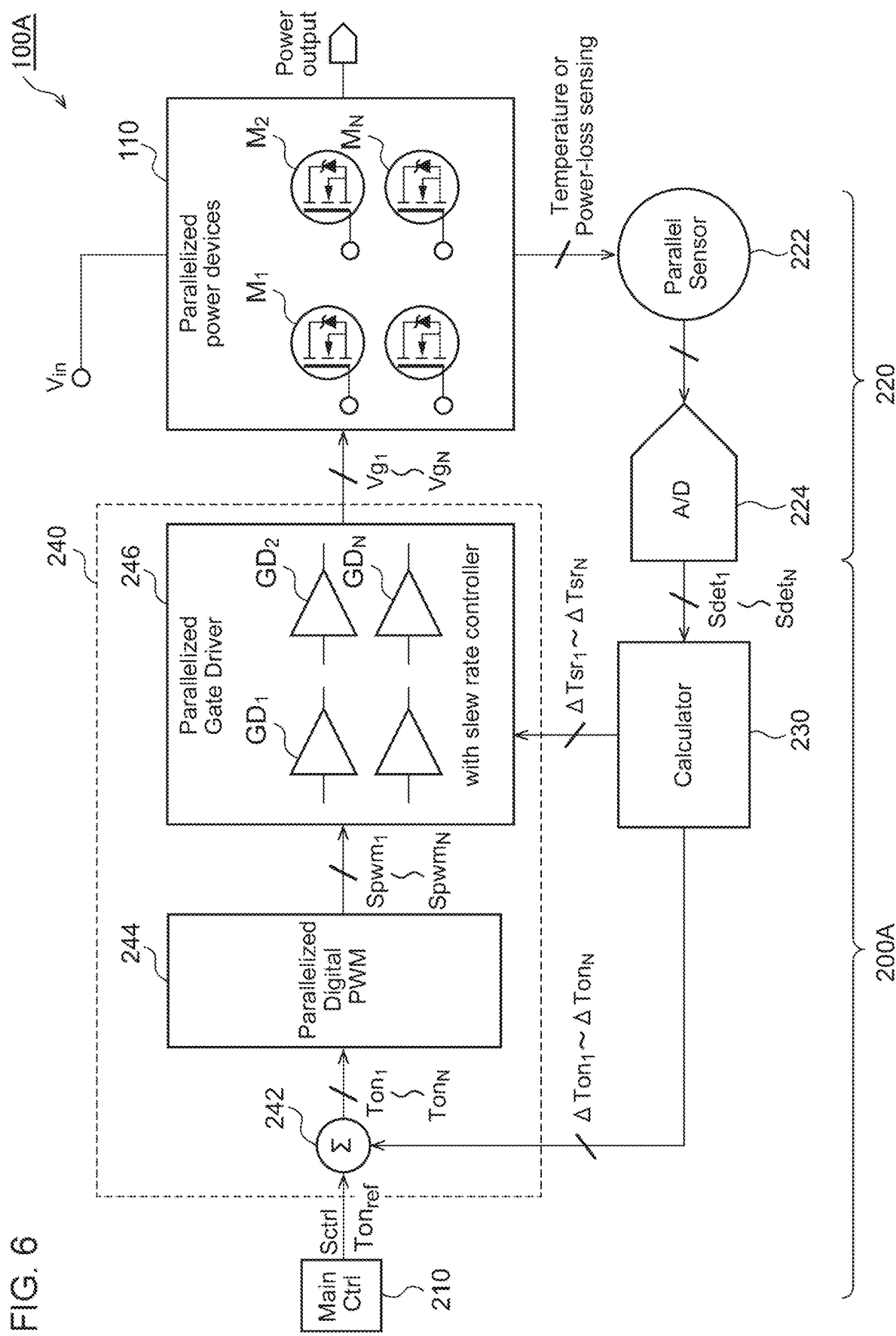
FIG. 6 is a block diagram of a switching circuit according to one embodiment.

FIG. 6 is a block diagram showing a switching circuit 100A according to one embodiment. In the switching circuit 100A, the controller 200A is configured as a digital circuit, and is configured to be capable of correcting both the pulse width and the slew rate.

The loss acquisition unit 220 includes a sensor group 222 and an A/D converter 224. The sensor group 222 generates multiple electrical signals having a correlation with the switching losses of the power transistors $M_1$ through $M_N$. The A/D converter 224 converts the electrical signals into digital detection values $Sdet_1$ through $Sdet_N$.

The correction amount calculation unit 230 generates correction values $Scomp_1$ through $Scomp_N$ such that the multiple detection values $Sdet_1$ through $Sdet_N$ each approach a common target value Sref. In the present embodiment, the correction value $Scomp_i$ includes a pulse width correction value $\Delta Ton_i$ and a slew rate correction value $\Delta Tsr_i$.

The gate signal generating unit 240 includes an adder 242, a digital PWM circuit 244, and a gate driving circuit 246. The adder 242 adds the pulse width correction amount $\Delta Ton_i$ to the pulse width instruction value Tonref indicated by the control instruction Sctrl generated by the main controller 210 so as to generate a corrected pulse width instruction value $Ton_i$.

$$Ton_i = Tonref + \Delta Ton_i$$

The digital PWM circuit 244 receives digital pulse width instruction values $Ton_1$ through $Ton_N$, and outputs PWM signals $Spwm_1$ through $Spwm_N$ each having a pulse width (duty cycle) that corresponds to the pulse width instruction value. The configuration of the digital PWM circuit 244 is not restricted in particular. That is to say, known techniques may preferably be employed. Examples of a method employed in the digital PWM circuit 244 include a method employing a counter that counts the on period, a method employing a variable delay circuit, a method employing a phase interpolation circuit, etc.

The gate driving circuit 246 includes multiple gate drivers $GD_1$ through $GD_N$. The multiple gate drivers $GD_1$ through $GD_N$ are each configured to provide a variable slew rate. The gate signal $Vg_1$ output from the i-th (i=1, 2, . . . , N) gate driver $GD_i$ is changed according to a slope that corresponds to the slew rate correction amount $\Delta Tsr_i$.

Figure 7:
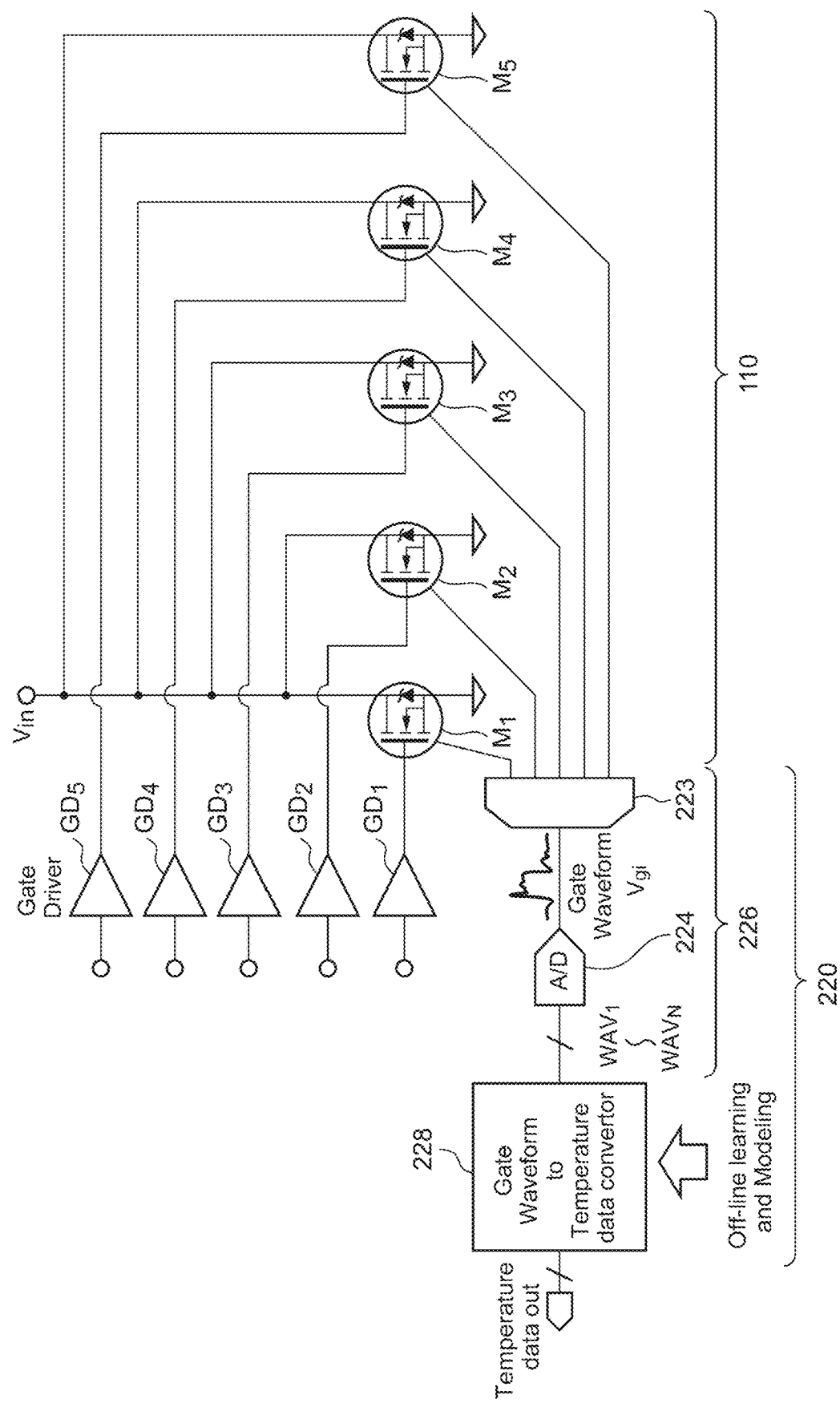
FIG. 7 is a block diagram showing an example configuration of a loss acquisition unit.

FIG. 7 is a block diagram showing an example configuration of the loss acquisition unit 220. FIG. 7 shows an arrangement in which N=5. However, N is not restricted to N=5. The channels that correspond to the power transistors $M_1$ through $M_5$ will be represented by Ch0 through Ch4, respectively. The loss acquisition unit 220 includes a waveform acquisition unit 226 and a temperature estimator 228. The waveform acquisition unit 226 includes an analog multiplexer 223 and an A/D converter 224. The analog multiplexer 223 selects the gate signals $Vg_1$ through $Vg_N$ of the multiple power transistors $M_1$ through $M_N$ in a time sharing manner. The A/D converter 224 converts the k-th (k=1, 2, . . . , N) gate signal $Vg_k$ selected by the analog multiplexer 223 into digital waveform data $WAV_k$. It should be noted that each power transistor may be provided with an A/D converter 224 without employing the analog multiplexer 223.

The temperature estimator 228 estimates the temperature of the corresponding power transistor $M_k$ based on the waveform data $WAV_k$ and generates a detection value $Sdet_k$. The temperature estimator 228 may be configured by machine learning. Specifically, the relation between the gate voltage waveform of the power transistor and the temperature is measured offline, and a learning model is generated by machine learning with the waveform as an input and with the temperature as an output. The temperature estimator 228 is implemented based on the learning model. This method requires no temperature sensor and no current sensor, thereby allowing the configuration to be designed in a simple manner.

As a detection value that indicates the switching loss of the power transistor, the threshold voltage of the power transistor can be used. For example, in the switching of the power transistor, the gate voltage is maintained at a predetermined level in the vicinity of the threshold voltage due to the Miller effect. Accordingly, an arrangement may be made in which the gate voltage at a constant level is detected so as to detect the threshold voltage. Also, other specific examples of such a method include similar methods described in Non-patent documents 1 through 3, and known techniques employing machine learning described in Non-patent document 4, etc.

Figure 8:
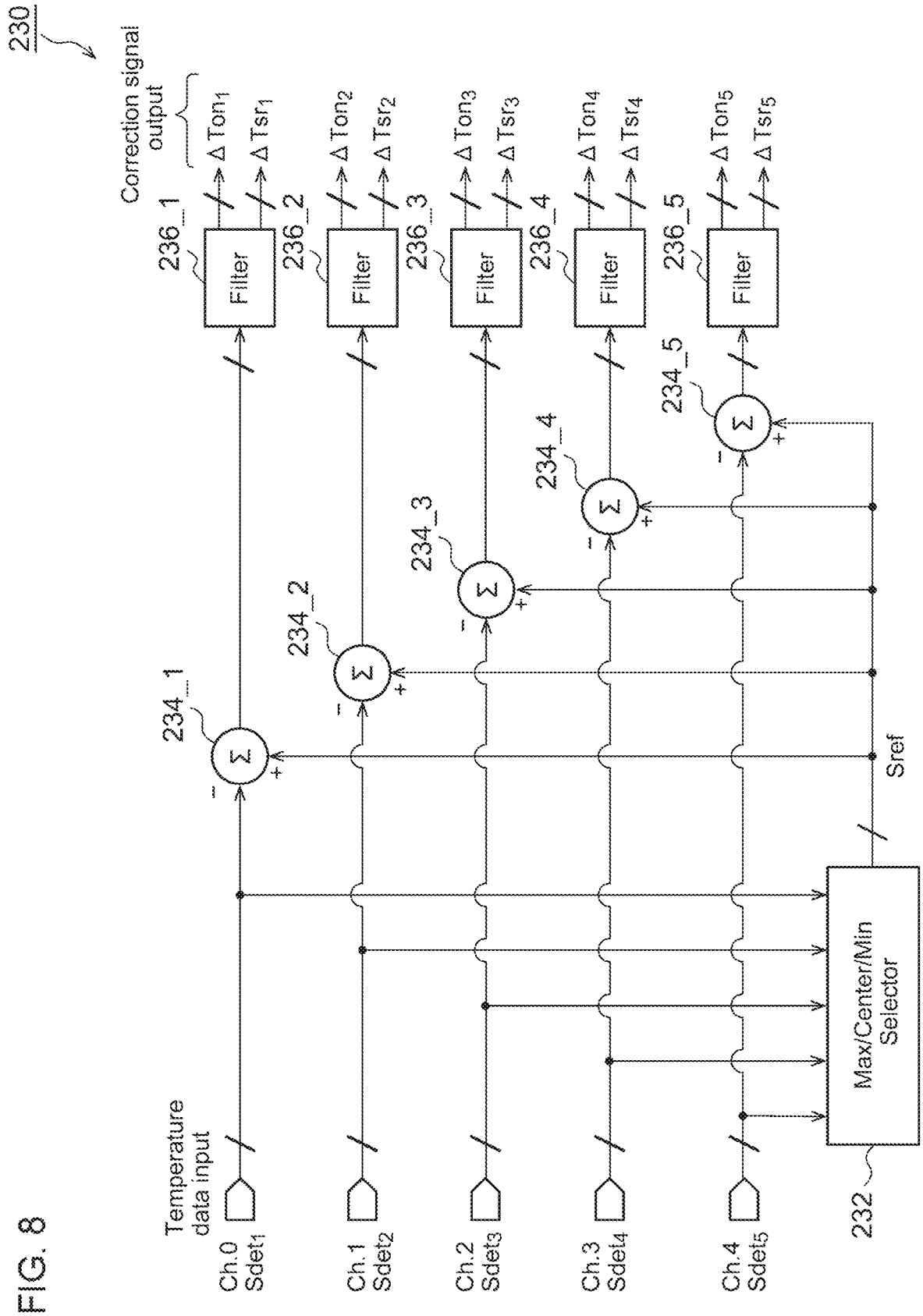
FIG. 8 is a block diagram showing an example configuration of a correction amount calculation unit.

FIG. 8 is a block diagram showing an example configuration of the correction amount calculation unit 230. The correction amount calculation unit 230 includes a reference value generating unit 232, multiple adder/subtractor units 234_1 through 234_N, and multiple filters 236_1 through 236_N. The reference value generating unit 232 generates the reference value Sref based on the multiple detection values $Sdet_1$ through $Sdet_N$. For example, the reference value generating unit 232 may select the maximum value of the multiple detection values $Sdet_1$ through $Sdet_N$ as the reference value Sref. Also, the reference value generating unit 232 may employ the center value of the multiple detection values $Sdet_1$ through $Sdet_N$ as the reference value Sref. Also, the reference value generating unit 232 may employ the average value of the multiple detection values $Sdet_1$ through $Sdet_N$ as the reference value Sref. Also, the reference value generating unit 232 may employ the minimum value of the multiple detection values $Sdet_1$ through $Sdet_N$ as the reference value Sref.

Each adder/subtractor 234_i outputs an error $e_i$ between the corresponding detection value $Sdet_1$ and the reference value Sref. Each filter 236_i generates the correction amounts $\Delta Ton_i$ and $\Delta Tsr_i$ based on the error $e_i$.

Figure 9:
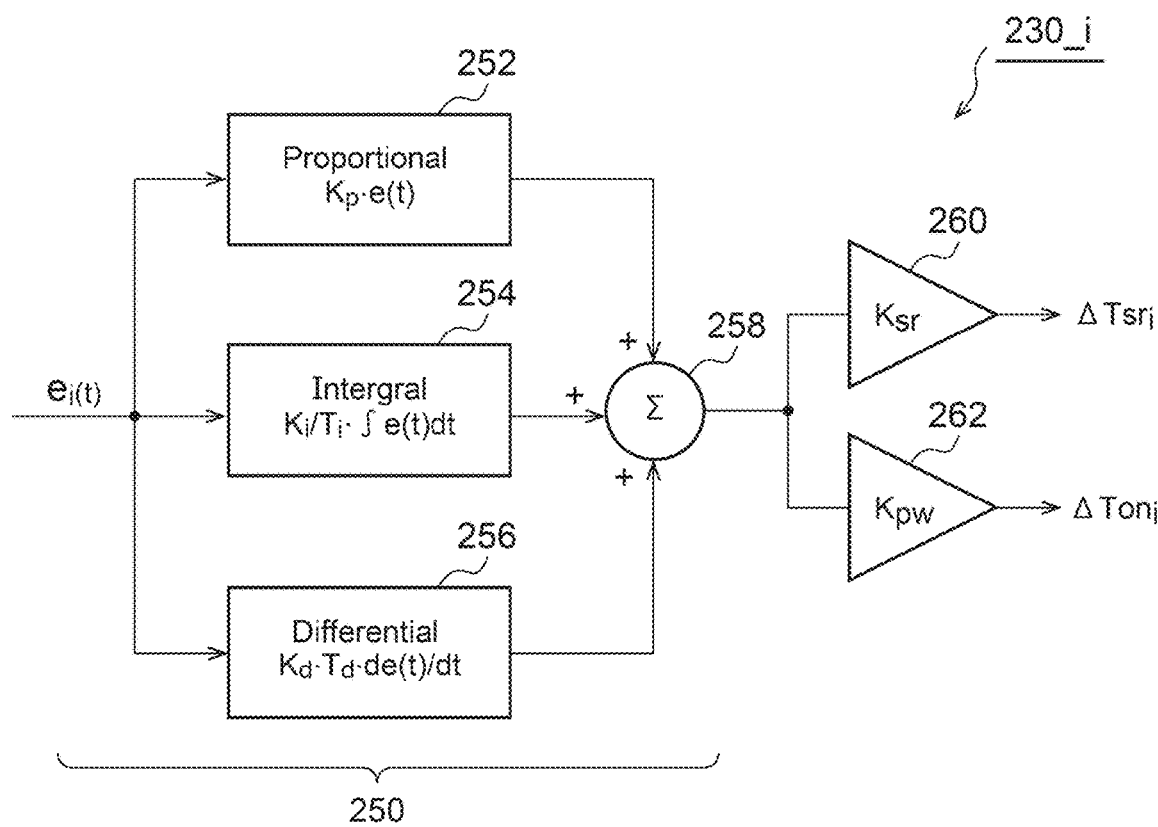
FIG. 9 is a block diagram showing an example configuration of a filter.

FIG. 9 is a block diagram showing an example configuration of the filter 236_i. The filter 236_i includes a proportional-integral-differential (PID) compensator 250. Giving consideration to the response speed and safety of the temperature control feedback loop, PID control is employed as an optimum control method. Specifically, the PID compensator 250 includes a proportional term calculation unit 252, an integral term calculation unit 254, a differential term calculation unit 256, an adder 258, and multipliers 260 and 262. The proportional term calculation unit 252 calculates a proportional term represented by $Kp \cdot e_i(t)$. Here, Kp represents the proportional gain. The integral term calculation unit 254 calculates an integral term represented by $Ki/Ti \cdot \int e_i(t) dt$. Here, Ki represents the integral gain, and Ti represents the integration time. The differential term calculation unit 256 calculates a differential term represented by $Kd/Td \cdot de_i(t)/dt$. Here, Kd represents the differential gain, and Td represents the derivative time. The adder 258 adds the proportional term, integral term, and differential term.

The first multiplier 260 multiplies the output of the PID compensator 250 by a first coefficient Ksr so as to generate a slew rate correction amount $\Delta Tsr_i$. The second multiplier 262 multiplies the output of the PID compensator 250 by a second coefficient Kpw so as to generate a second correction amount $\Delta Ton_i$.

Description has been made in this example in which the PID compensator 250 is shared by the pulse width correction and the slew rate correction. However, the present invention is not restricted to such an example. Also, a pulse width correction compensator and a slew rate correction compensator may be provided as separate compensators. In this case, the coefficients Kp, Ki, and Kd can be provided individually for the pulse width correction and the slew rate correction.

Next, description will be made regarding a specific example with respect to the slew rate correction and the pulse width correction.

Figure 10:
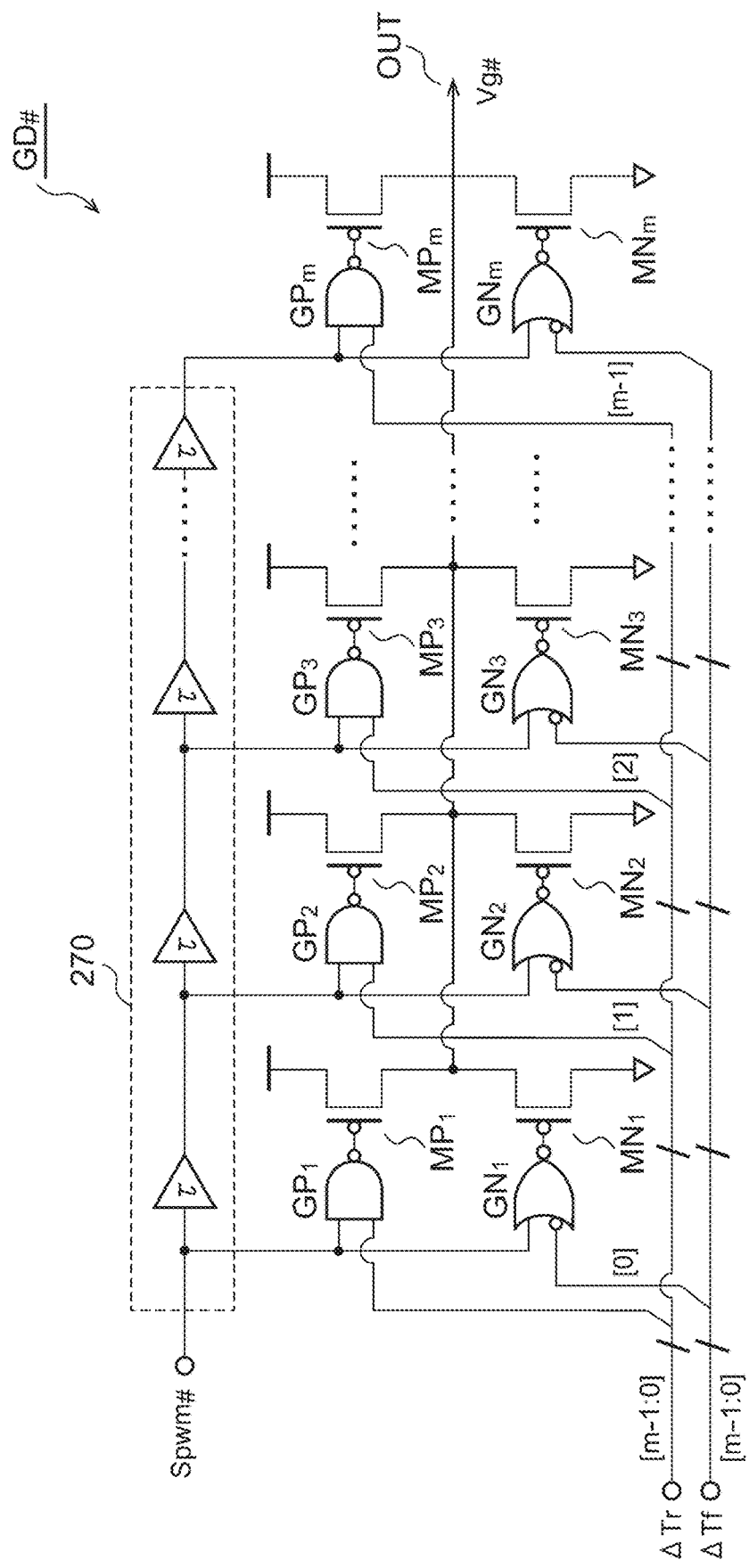
FIG. 10 is a circuit diagram of a gate driver with a slew rate correction function.

FIG. 10 is a circuit diagram of a gate driver $GD_\#$ (#=1, 2, . . . , N) with a slew rate correction function. The gate driver $GD_\#$ is arranged such that the corresponding control pulse $Spwm_\#$ is input to its input node IN, and its output node OUT is coupled to the gate of the corresponding power transistor $M_\#$. The gate driver $GD_\#$ receives a first control code that corresponds to a slew rate correction amount $\Delta Tr$ and a second control code that corresponds to a slew rate correction amount $\Delta Tf$ as inputs. The first control code $\Delta Tr$ and the second control code $\Delta Tf$ are each configured as m-bit code.

A multi-stage delay circuit 270 delays the control pulse Spwm #. The multi-stage delay circuit 270 outputs multiple non-delayed or delayed control pulses.

The multiple first transistors $MP_1$ through $MP_m$ are each configured as a P-channel MOS transistor. Each first transistor MP is arranged such that one end (source) is coupled to a first voltage line, and the other end (drain) is coupled to an output node OUT. The multiple second transistors $MN_1$ through $MN_m$ are each configured as an N-channel MOS transistor. Each second transistor $M_N$ is arranged such that one end (source) is coupled to a second voltage line, and the other end (drain) is coupled to the output node OUT.

Multiple first logic gates $GP_1$ through $GP_m$ are each configured as a NAND gate. When the corresponding bit of the first control code $\Delta Tr$ is a predetermined value (true, e.g., 1), the j-th (j=1, 2, ..., M) first logic gate $GP_j$ supplies the corresponding output of the multi-stage delay circuit 270 to the gate of the corresponding first transistor $MP_j$. When the corresponding bit of the first control code $\Delta Tr$ is not the predetermined value (false, e.g., 0), the j-th first logic gate $GP_j$ outputs a high-level signal so as to fix the corresponding first transistor $MP_j$ to the off state.

Multiple second logic gates $GN_1$ through $GN_M$ are each configured as a NOR gate. When the corresponding bit of the first control code $\Delta Tr$ is a predetermined value (e.g., 1), the j-th second logic gate $GN_j$ supplies the corresponding output of the multi-stage delay circuit 270 to the gate of the corresponding second transistor $MN_j$. When the corresponding bit of the second control code $\Delta Tf$ is not the predetermined value (false, e.g., 0), the j-th second logic gate $GN_j$ outputs the low-level signal so as to fix the corresponding second transistor $MN_j$ to the off state.

Figure 11:
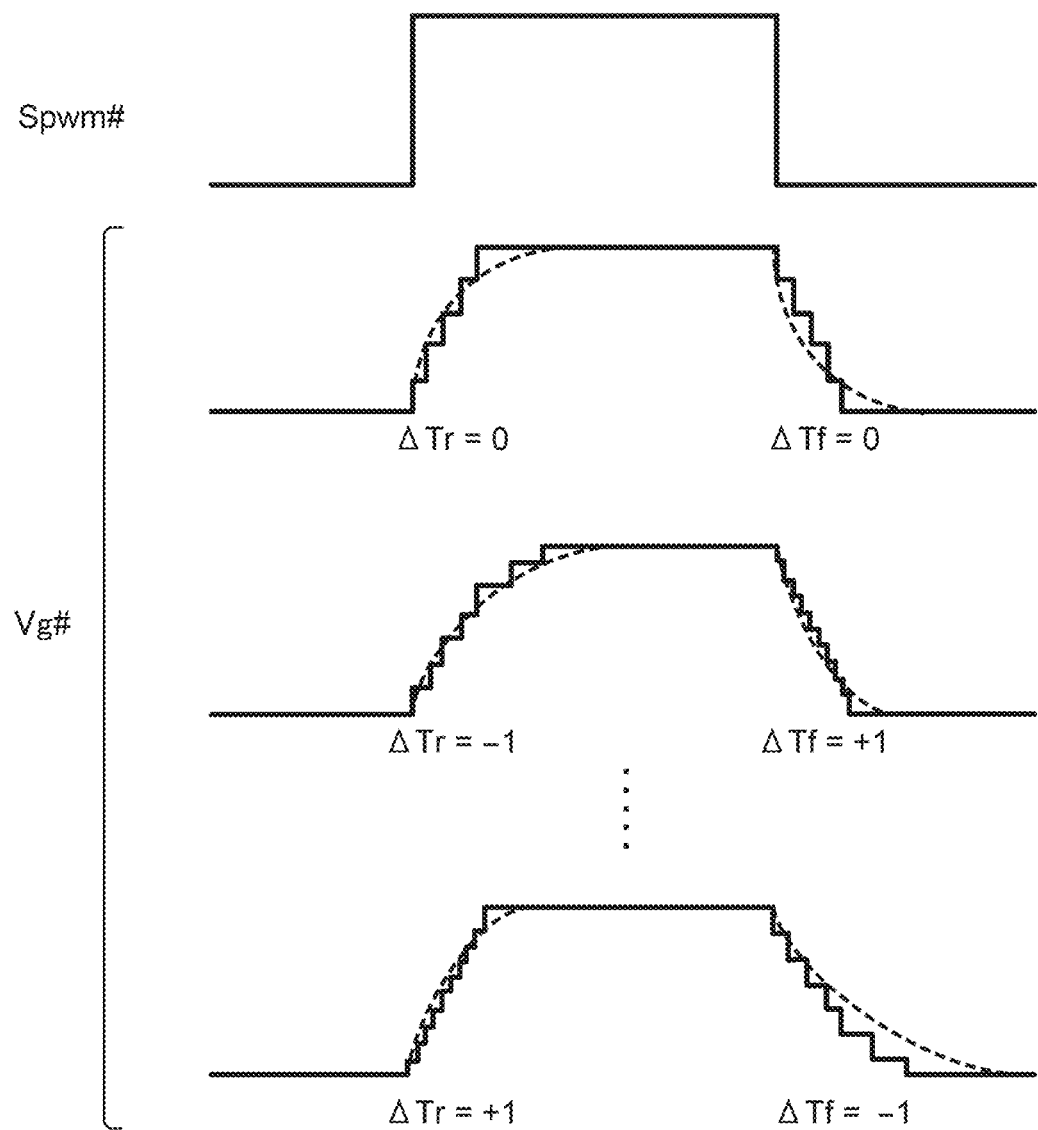
FIG. 11 is a diagram for explaining the operation of the gate driver with the slew rate correction function shown in FIG. 10.

FIG. 11 is a diagram for explaining the operation of the gate driver $GD_\#$ with the slew rate correction function shown in FIG. 10. The first control code $\Delta Tr$ and the second control code $\Delta Tf$ are each represented as a relative value that corresponds to the reference value. By adding or subtracting the first control code $\Delta Tr$ to or from the reference value, such an arrangement is capable of adjusting the slew rate (slope) of the positive edge of the gate signal $Vg_\#$ of the gate driver $GD_\#$ to a steep slope or a gentle slope.

Similarly, by adding or subtracting the second control code $\Delta Tf$ to or from the reference value, such an arrangement is capable of adjusting the slew rate (slope) of the negative edge of the gate signal $Vg_\#$ of the gate driver $GD_\#$ to a steep slope or a gentle slope.

Usage

Next, description will be made regarding the usage of the switching circuit 100.

Figure 12:
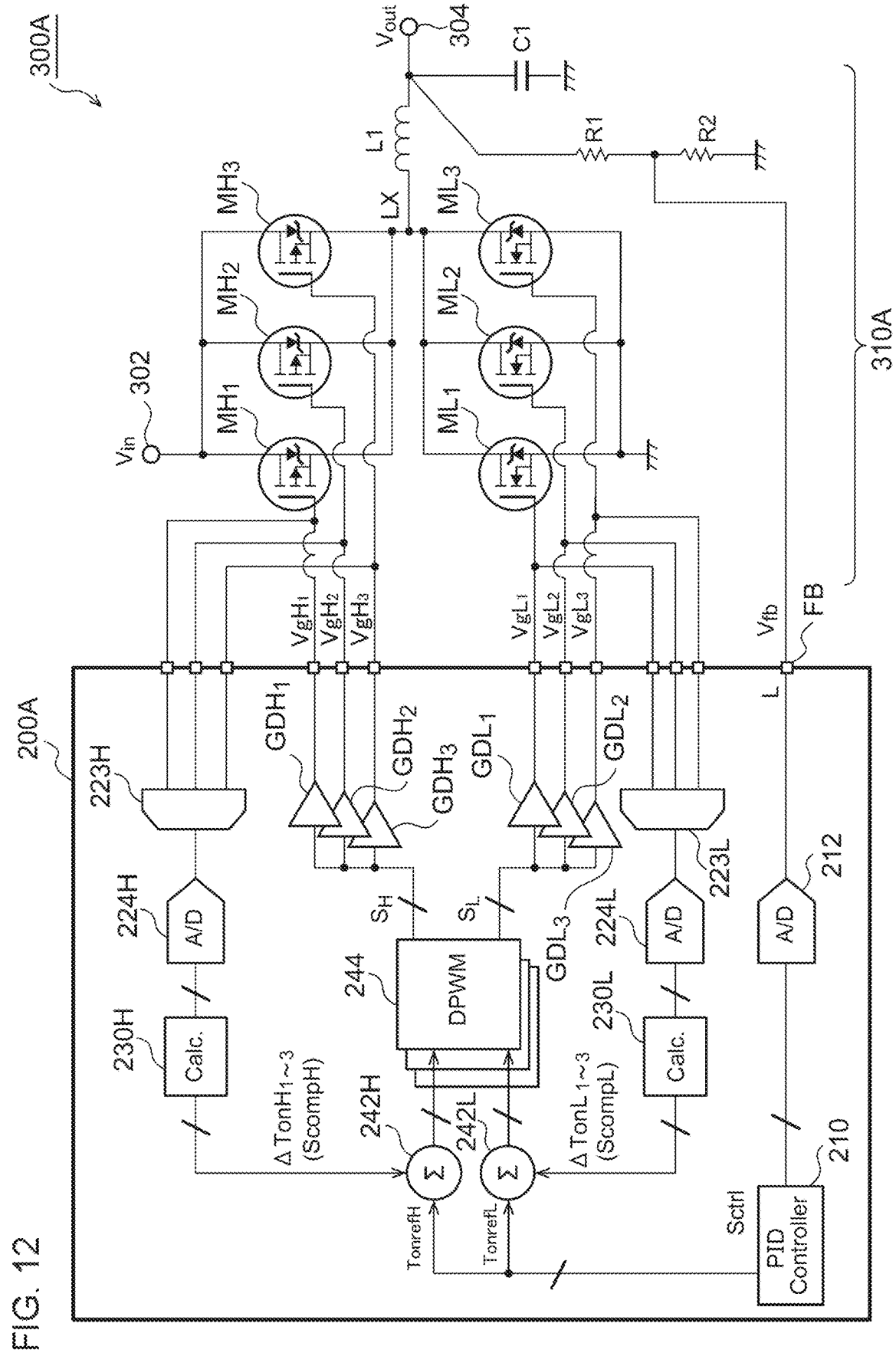
FIG. 12 is a circuit diagram of a DC/DC converter.

FIG. 12 is a circuit diagram of a DC/DC converter 300A. The DC/DC converter 300A is configured as a synchronous rectification step-down (buck) DC/DC converter. The DC/DC converter 300A steps down the input voltage Vin of the input line 302 so as to generate the output voltage Vout at an output line 304.

The DC/DC converter 300A is provided with a controller 200A and a peripheral circuit 310A thereof. The peripheral circuit 310A includes a high-side transistor MH, a low-side transistor ML, an inductor L1, and an output capacitor C1.

The high-side transistor MH and the low-side transistor ML are arranged in series between the input line 302 and the ground. The inductor L1 is arranged between the output line 304 and a coupling node (switching node) LX that couples the high-side transistor MH and the low-side transistor ML. The output capacitor C1 is coupled to the output line 304.

The high-side transistor MH includes multiple (N=3 in this example) power transistors $MH_1$ through $MH_3$ coupled in parallel. The low-side transistor ML includes multiple (N=3 in this example) power transistors $ML_1$ through $ML_3$ coupled in parallel.

A feedback signal Vfb that corresponds to the output of the DC/DC converter 300A is input to a feedback pin FB of the controller 200A. Description has been made in this example regarding an arrangement in which the voltage obtained by dividing the output voltage Vout by means of resistors R1 and R2 is employed as the feedback signal Vfb. However, the present invention is not restricted to such an arrangement. Also, the output voltage Vout itself may be employed as the feedback signal Vfb. In a case in which the DC/DC converter 300A is configured as a constant current output converter, the output current of the DC/DC converter 300A may be employed as the feedback signal Vfb. Also, a voltage at an internal node of a load coupled to the output line 304 of the DC/DC converter 300A may be employed as the feedback signal Vfb. Also, a current that flows through an internal node of a load may be employed as the feedback signal Vfb.

A driving circuit of the high-side transistor MH and a driving circuit of the low-side transistor ML are integrated in the controller 200A, and the respective components will be distinguished by an appended suffix H or L.

An A/D converter 212 converts the feedback signal Vfb into a digital signal. The main controller 210 generates the control instruction Sctrl such that the feedback signal Vfb approaches a predetermined target value. The control instruction Sctrl is configured as a duty cycle instruction value including a pulse width instruction value TonrefH for the high-side transistor and a pulse width instruction value TonrefL for the low-side transistor.

An analog multiplexer 223L and an A/D converter 224L detect the gate signals $VgL_1$ through $VgL_3$ of the low-side power transistors $ML_1$ through $ML_3$. A correction amount calculation unit 230L estimates the temperature of each of the power transistors $ML_1$ through $ML_3$ based on the gate signals $VgL_1$ through $VgL_3$, and generates correction amounts $ScompL_1$ through $ScompL_3$ such that the temperatures of the power transistors $ML_1$ through $ML_3$ become equal.

In the same manner, correction amounts $ScompH_1$ through $ScompL_3$ for the high-side power transistors $MH_1$ through $MH_3$ are generated by means of an analog multiplexer 223H, an A/D converter 224H, and a correction amount calculation unit 230H.

The correction amounts ScompL and ScompH can each include at least one of the duty cycle correction amount and the slew rate correction amount. Description will be made in this example regarding an arrangement in which the correction amounts ScompL and ScompH each include the duty cycle correction amounts $\Delta TonL_1$ through $\Delta TonL_3$ and $\Delta TonH_1$ through $\Delta TonH_3$.

An adder 242L adds the correction amounts $\Delta TonL_1$ through $\Delta TonL_3$ to the pulse width instruction value TonrefL, so as to generate the pulse width instruction values TonL$_1$ through TonL$_3$ for the power transistors ML$_1$ through ML$_3$, respectively. Similarly, an adder 242H adds the correction amounts ΔTonH$_1$ through ΔTonH$_3$ to the pulse width instruction value TonrefH, so as to generate the pulse width instruction values TonH$_1$ through TonH$_3$ for the power transistors MH$_1$ through MH$_3$, respectively.

The digital PWM circuit 244 generates PWM pulses SH$_1$ through SH$_3$ and SL$_1$ through SL$_3$ based on the corrected pulse width instruction values TonL$_1$ through TonL$_3$ and TonH$_1$ through TonH$_3$. The gate drivers GDH$_1$ through GDH$_3$ drive the power transistors MH$_1$ through MH$_3$ according to the PWM pulses SH$_1$ through SH$_3$. Furthermore, the gate drivers GDL$_1$ through GDL$_3$ drive the power transistors ML$_1$ through ML$_3$ according to the PWM pulses SL$_1$ through SL$_3$.

The above is the configuration of the DC/DC converter 300A. With the DC/DC converter 300A, this allows the heat generation amount of the multiple power transistors MH$_1$ through MH$_3$ to be made uniform. In the same manner, this allows the heat generation amount of the multiple power transistors ML$_1$ through ML$_3$ to be made uniform.

It should be noted that the DC/DC converter 300A may be configured as a step-up converter or a step-up/step-down converter. The DC/DC converter 300A is not restricted to a synchronous rectification converter. Also, the DC/DC converter 300A may be configured as a diode rectification converter.

Figure 13:
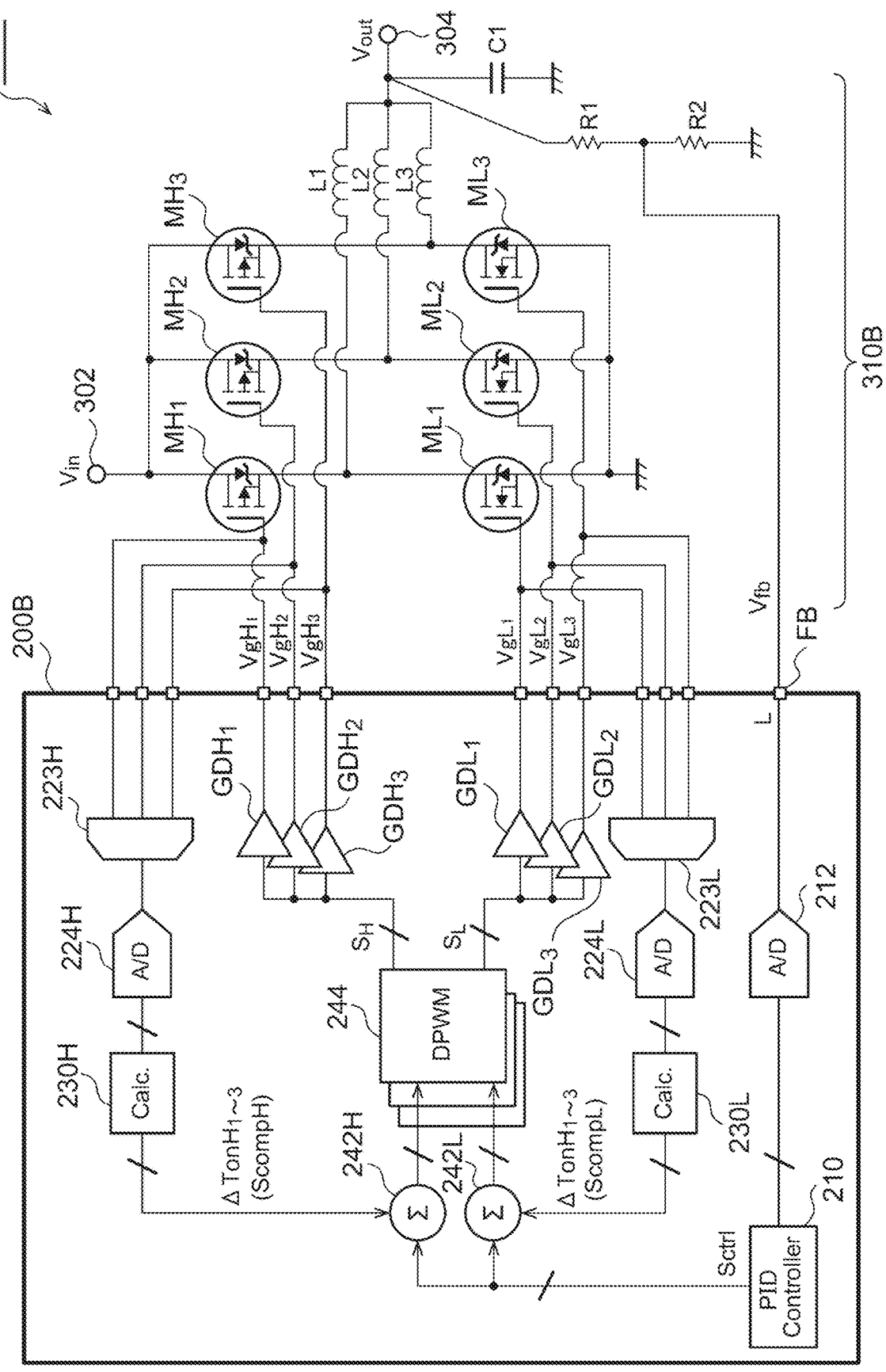
FIG. 13 is a circuit diagram of a DC/DC converter.

FIG. 13 is a circuit diagram of a DC/DC converter 300B. The DC/DC converter 300B is configured as an N-phase multi-phase converter. Furthermore, the DC/DC converter 300B is configured as a synchronous rectification step-down (Buck) converter as with the converter shown in FIG. 12.

Description will be made in this example regarding a converter with N=3 phases. A peripheral circuit 310B includes three power transistors MH$_1$ through MH$_3$, three power transistors ML$_1$ through ML$_3$, three inductors L1 through L3, an output capacitor C1, and resistors R1 and R2.

The controller 200B has the same basic configuration as that shown in FIG. 12. There is a difference in the operation between the digital PWM circuit 244 included in the multi-phase converter and the digital PWM circuit 244 shown in FIG. 12. The digital PWM circuit 244 generates N PWM pulses SH$_1$ through SH$_N$ with phases shifted by 360°/N. In the same manner, the digital PWM circuit 244 generates N PWM pulses SL$_1$ through SL$_N$ with phases shifted by 360°/N.

Figure 14:
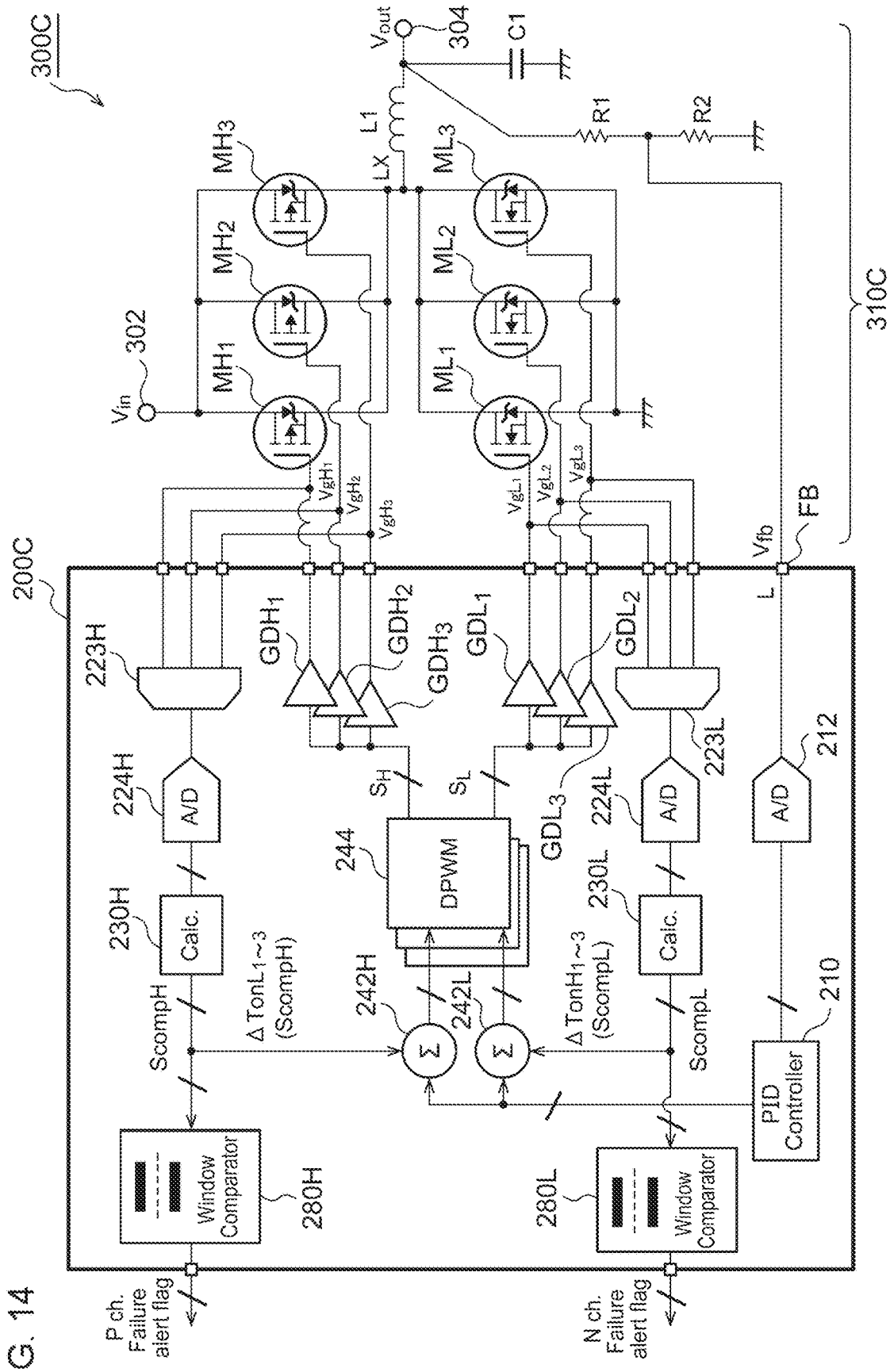
FIG. 14 is a circuit diagram of a DC/DC converter.

FIG. 14 is a circuit diagram of a DC/DC converter 300C. The DC/DC converter 300C is configured as a step-down converter as with the DC/DC converter 300A shown in FIG. 12.

In addition to the configuration of the controller 200A shown in FIG. 12, a controller 200C includes monitoring circuits 280L and 280H. The monitoring circuit 280L generates a warning flag based on the multiple correction amounts ScompL$_1$ through ScompL$_3$. In a case in which aging degradation of the power transistors progresses such that it is difficult to provide temperature smoothing, overflow or underflow occurs in the correction amounts ScompL$_1$ through ScompL$_3$. In order to solve such a problem, when overflow or underflow occurs in the correction amounts ScompL$_1$ through ScompL$_3$, the monitoring circuit 280L asserts a warning flag. When the warning flag is asserted, such an arrangement enables an operation such as a system stop operation, an operation that prompts the user to perform maintenance, etc., thereby providing the system with improved reliability.

Also, when the correction amounts ScompL$_1$ through ScompL$_3$ deviate from a predetermined normal range, the monitoring circuit 280L may judge that aging degradation has progressed and may assert a warning flag. Also, the monitoring circuit 280L may generate an index that indicates the degree of aging degradation of each of the power transistors ML$_1$ through ML$_3$ based on the correction amounts ScompL$_1$ through ScompL$_3$. The monitoring circuit 280H is designed in the same manner. That is to say, the monitoring circuit 280H is capable of monitoring aging degradation of the power transistors MH$_1$ through MH$_3$ based on the correction amounts ScompH$_1$ through ScompH$_3$.

Description has been made with reference to FIGS. 12 through 14 regarding examples employing pulse width correction. Instead of or in addition to the pulse width correction, the slew rate correction function may be implemented.

The usage of the switching circuit 100 is not restricted to such a DC/DC converter. Also, the switching circuit 100 may be applied to an inverter, rectifier circuit, motor driving circuit, and battery charger circuit. For example, multiple power transistors may form an upper arm or a lower arm of an inverter.

Notes

The following techniques are disclosed in the present specification.

Item 1

A controller structured to control a plurality of parallel-coupled power transistors, the controller comprising:
a correction amount calculation unit structured to generate a reference value based on a plurality of detection values, each of which has a correlation with a switching loss of corresponding one of the plurality of power transistors, and to generate a plurality of correction amounts such that the plurality of detection values approach the reference value; and
a gate signal generating unit structured to generate a plurality of gate signals that correspond to the plurality of power transistors based on a control instruction and the plurality of correction amounts.

Item 2

The controller described in item 1, wherein the gate signal generating unit corrects a pulse width of a gate signal of each of the plurality of power transistors based on a corresponding one of the plurality of correction amounts.

Item 3

The controller described in item 1 or 2, wherein the gate signal generating unit corrects a slew rate of the gate signal of each of the plurality of power transistors based on a corresponding one of the plurality of correction amounts.

Item 4

The controller described in any one of items 1 through 3, wherein the detection value is based on a temperature detection value that indicates a temperature of the power transistor.

Item 5

The controller described in any one of items 1 through 3, wherein the detection value is based on a threshold voltage of the power transistor.

Item 6

The controller described in any one of items 1 through 3, further comprising:
- a waveform acquisition unit structured to measure a waveform of a gate voltage of each of the plurality of power transistors; and
- a temperature estimator structured to generate a corresponding one of the plurality of detection values based on a waveform of the gate voltage of each of the plurality of power transistors.

Item 7

The controller described in item 6, wherein the temperature estimator comprises an estimator based on a learning model obtained by machine learning.

Item 8

The controller described in any one of items 1 through 3, wherein the detection value is based on a product of a measured value of a drain current and a measured value of a drain-source voltage of the power transistor.

Item 9

The controller described in any one of items 1 through 8, wherein the correction amount calculation unit comprises a plurality of proportional-integral-differential (PID) compensators.

Item 10

The controller described in item 9, wherein the correction amount calculation unit comprises:
- a plurality of first multipliers structured to multiply outputs of the plurality of PID compensators by a first coefficient so as to generate a plurality of first correction amounts; and
- a plurality of second multipliers structured to multiply outputs of the plurality of PID compensators by a second coefficient so as to generate a plurality of second correction amounts,
- wherein the gate signal generating unit corrects a slew rate of the gate signal of each of the plurality of power transistors based on a corresponding one of the plurality of first correction amounts,
- and wherein the gate signal generating unit corrects a pulse width of the gate signal of each of the plurality of power transistors based on a corresponding one of the plurality of second correction amounts.

Item 11

The controller described in item 3, wherein the gate signal generating unit comprises a plurality of gate drivers that correspond to the plurality of power transistors,
- and wherein the plurality of gate drivers each comprise:
  - an output node coupled to a gate of the corresponding power transistor;
  - a multi-stage delay circuit structured to delay a control pulse;
  - a plurality of first transistors each arranged such that one end thereof is coupled to a first voltage line and the other end thereof is coupled to the output node;
  - a plurality of second transistors each arranged such that one end thereof is coupled to a second voltage line and the other end thereof is coupled to the output node;
  - a plurality of first logic gates that correspond to the plurality of first transistors, and structured such that, when a corresponding bit of a first control code is a predetermined value, the corresponding first logic gate supplies a corresponding output of the multi-stage delay circuit to a gate of the corresponding first transistor; and
  - a plurality of second logic gates that correspond to the plurality of second transistors, and structured such that, when a corresponding bit of a second control code is a predetermined value, the corresponding second logic gate supplies a corresponding output of the multi-stage delay circuit to a gate of the corresponding second transistor.

Item 12

The controller described in any one of items 1 through 11, further comprising a monitoring circuit structured to generate a warning flag based on the plurality of correction amounts.

Item 13

The controller described in any one of items 1 through 12, further comprising an A/D converter structured to convert a plurality of detection signals, each of which has a correlation with a switching loss of corresponding one of the plurality of power transistors into the plurality of detection values.

Item 14

The controller described in any one of items 1 through 13, wherein the plurality of power transistors are each configured as a switching transistor or a synchronous rectification transistor of a switching converter.

Item 15

The controller described in item 14, wherein the switching converter is configured as a multi-phase switching converter,
- and wherein the switching converter outputs respective gate signals of the plurality of power transistors with a phase difference of 360°/N.

Item 16

The controller described in any one of items 1 through 13, wherein the plurality of power transistors form an upper arm or a lower arm of an inverter.

Item 17

A control method for a plurality of power transistors provided on a plurality of paths arranged in parallel, the method comprising:

generating a plurality of detection values, each of which has a correlation with a switching loss of corresponding one of the plurality of power transistors;
generating a reference value based on the plurality of detection values;
generating a plurality of correction amounts that correspond to the plurality of power transistors such that each correction amount is generated such that an error between the reference value and a corresponding one of the plurality of detection values approaches zero; and
correcting a gate signal of each of the plurality of power transistors based on a corresponding one of the plurality of correction amounts.

Item 18

A controller to be employed in a power conversion apparatus provided with a plurality of parallel-coupled power transistors, the controller comprising:
a main controller structured to calculate a duty cycle instruction value of a control pulse such that a state of the power conversion apparatus approaches a target state;
an A/D converter structured to convert a plurality of electrical signals, each of which has a correlation with a switching loss of corresponding one of the plurality of power transistors into a plurality of digital detection values;
a correction amount calculation unit structured to generate a reference value based on the plurality of detection values, and to generate a plurality of correction amounts such that the plurality of detection values approach the reference value;
a duty cycle correction unit structured to correct the duty cycle instruction value based on the plurality of correction amounts so as to generate a plurality of corrected duty cycle instruction values; and
a pulse converter structured to receive the plurality of corrected duty cycle instruction values, and to generate a plurality of gate signals that correspond to the plurality of power transistors.

Item 19

A controller to be employed in a power conversion apparatus provided with a plurality of parallel-coupled power transistors, the controller comprising:
a main controller structured to calculate a duty cycle instruction value of a control pulse such that a state of the power conversion apparatus approaches a target state;
an A/D converter structured to convert a plurality of electrical signals, each of which hays a correlation with a switching loss of corresponding one of the plurality of power transistors into a plurality of digital detection values;
a correction amount calculation unit structured to generate a reference value based on the plurality of detection values, and to generate a plurality of correction amounts such that the plurality of detection values approach the reference value;
a pulse converter structured to generate the control pulse having a duty cycle that corresponds to the duty cycle instruction value; and
a gate signal generating unit structured to receive the control pulse and the plurality of correction amounts, and to generate a plurality of gate signals each having a slew rate that corresponds to a corresponding one of the plurality of correction amounts.

While the preferred embodiments of the present disclosure have been described using specific terms, such description is for illustrative purposes only, and it is to be understood that changes and variations may be made without departing from the spirit or scope of the appended claims.

What is claimed is:

1. A controller structured to control a plurality of parallel-coupled power transistors, the controller comprising:
a correction amount calculation unit structured to generate a reference value based on a plurality of detection values, each of which has a correlation with a switching loss of corresponding one of the plurality of power transistors, and to generate a plurality of correction amounts such that the plurality of detection values approach the reference value; and
a gate signal generating unit structured to generate a plurality of gate signals that correspond to the plurality of power transistors based on a control instruction and the plurality of correction amounts.

2. The controller according to claim 1, wherein the gate signal generating unit corrects a pulse width of a gate signal of each of the plurality of power transistors based on a corresponding one of the plurality of correction amounts.

3. The controller according to claim 1, wherein the gate signal generating unit corrects a slew rate of the gate signal of each of the plurality of power transistors based on a corresponding one of the plurality of correction amounts.

4. The controller according to claim 1, wherein the detection value is based on a temperature detection value that indicates a temperature of the power transistor.

5. The controller according to claim 1, wherein the detection value is based on a threshold voltage of the power transistor.

6. The controller according to claim 1, further comprising:
a waveform acquisition unit structured to measure a waveform of a gate voltage of each of the plurality of power transistors; and
a temperature estimator structured to generate a corresponding one of the plurality of detection values based on a waveform of the gate voltage of each of the plurality of power transistors.

7. The controller according to claim 6, wherein the temperature estimator comprises an estimator based on a learning model obtained by machine learning.

8. The controller according to claim 1, wherein the detection value is based on a product of a measured value of a drain current and a measured value of a drain-source voltage of the power transistor.

9. The controller according to claim 1, wherein the correction amount calculation unit comprises a plurality of proportional-integral-differential (PID) compensators.

10. The controller according to claim 9, wherein the correction amount calculation unit comprises:
a plurality of first multipliers structured to multiply outputs of the plurality of PID compensators by a first coefficient so as to generate a plurality of first correction amounts; and
a plurality of second multipliers structured to multiply outputs of the plurality of PID compensators by a second coefficient so as to generate a plurality of second correction amounts,
wherein the gate signal generating unit corrects a slew rate of the gate signal of each of the plurality of power transistors based on a corresponding one of the plurality of first correction amounts, and wherein the gate signal generating unit corrects a pulse width of the gate signal of each of the plurality of power transistors based on a corresponding one of the plurality of second correction amounts.

11. The controller according to claim 3, wherein the gate signal generating unit comprises a plurality of gate drivers that correspond to the plurality of power transistors, and wherein the plurality of gate drivers each comprise:
an output node coupled to a gate of the corresponding power transistor;
a multi-stage delay circuit structured to delay a control pulse;
a plurality of first transistors each having one end coupled to a first voltage line and the other end coupled to the output node;
a plurality of second transistors each having one end coupled to a second voltage line and the other end coupled to the output node;
a plurality of first logic gates that correspond to the plurality of first transistors, and structured such that, when a corresponding bit of a first control code is a predetermined value, the corresponding first logic gate supplies a corresponding output of the multi-stage delay circuit to a gate of the corresponding first transistor; and
a plurality of second logic gates that correspond to the plurality of second transistors, and structured such that, when a corresponding bit of a second control code is a predetermined value, the corresponding second logic gate supplies a corresponding output of the multi-stage delay circuit to a gate of the corresponding second transistor.

12. The controller according to claim 1, further comprising a monitoring circuit structured to generate a warning flag based on the plurality of correction amounts.

13. The controller according to claim 1, further comprising an A/D converter structured to convert a plurality of detection signals, each of which has a correlation with a switching loss of corresponding one of the plurality of power transistors into the plurality of detection values.

14. The controller according to claim 1, wherein the plurality of power transistors are each configured as a switching transistor or a synchronous rectification transistor of a switching converter.

15. The controller according to claim 14, wherein the switching converter is configured as a multi-phase switching converter,
and wherein the switching converter outputs respective gate signals of the plurality of power transistors with a phase difference of 360°/N.

16. The controller according to claim 1, wherein the plurality of power transistors form an upper arm or a lower arm of an inverter.

17. A controller to be employed in a power conversion apparatus provided with a plurality of parallel-coupled power transistors, the controller comprising:
a main controller structured to calculate a duty cycle instruction value of a control pulse such that a state of the power conversion apparatus approaches a target state;
an A/D converter structured to convert a plurality of electrical signals, each of which has a correlation with a switching loss of corresponding one of the plurality of power transistors into a plurality of digital detection values;
a correction amount calculation unit structured to generate a reference value based on the plurality of detection values, and to generate a plurality of correction amounts such that the plurality of detection values approach the reference value;
a duty cycle correction unit structured to correct the duty cycle instruction value based on the plurality of correction amounts so as to generate a plurality of corrected duty cycle instruction values; and
a pulse converter structured to receive the plurality of corrected duty cycle instruction values, and to generate a plurality of gate signals that correspond to the plurality of power transistors.

18. A controller to be employed in a power conversion apparatus provided with a plurality of parallel-coupled power transistors, the controller comprising:
a main controller structured to calculate a duty cycle instruction value of a control pulse such that a state of the power conversion apparatus approaches a target state;
an A/D converter structured to convert a plurality of electrical signals, each of which has a correlation with a switching loss of corresponding one of the plurality of power transistors into a plurality of digital detection values;
a correction amount calculation unit structured to generate a reference value based on the plurality of detection values, and to generate a plurality of correction amounts such that the plurality of detection values approach the reference value;
a pulse converter structured to generate the control pulse having a duty cycle that corresponds to the duty cycle instruction value; and
a gate signal generating unit structured to receive the control pulse and the plurality of correction amounts, and to generate a plurality of gate signals each having a slew rate that corresponds to a corresponding one of the plurality of correction amounts.

* * * * *